United States Patent
Makimura et al.

[19]

[11] Patent Number: 5,862,086
[45] Date of Patent: Jan. 19, 1999

[54] SEMICONDUCTOR STORAGE DEVICE

[75] Inventors: Chisa Makimura, Hamura; Yukihide Suzuki, Akishima; Shunichi Sukegawa, Tsukuba; Hiroyuki Fujiwara, Tsuchiura; Masayuki Hira, Tachikawa, all of Japan

[73] Assignees: Hitachi Ltd., Tokyo, Japan; Texas Instuments Incorporated, Dallas, Tex.

[21] Appl. No.: 701,348

[22] Filed: Aug. 22, 1996

[30] Foreign Application Priority Data

Aug. 23, 1995 [JP] Japan ................................. 7-237664

[51] Int. Cl.⁶ ..................................................... G11C 7/00
[52] U.S. Cl. ................. 365/200; 365/189.07; 365/225.7; 365/230.06
[58] Field of Search ............................... 365/200, 230.06, 365/189.07, 225.7

[56] References Cited

U.S. PATENT DOCUMENTS 5,581,508  12/1996  Sasaki et al. ............................ 365/200
5,666,314  9/1997  Akaogi et al. ............................ 365/200

FOREIGN PATENT DOCUMENTS

A-61-20293  1/1986  Japan .
A-2-158995  6/1990  Japan .

*Primary Examiner*—Do Hyun Yoo
*Attorney, Agent, or Firm*—Antonelli, Terry, Stout & Kraus, LLP

[57] ABSTRACT

A semiconductor storage device is provided with a storage circuit for a faulty address and a plurality of redundant word lines corresponding to the storage circuit. The storage circuit is adapted to store a faulty address required for selecting a redundant word line. The faulty address is compared with an address input at the time of memory access by a comparator. Using a coincidence signal produced from the comparator and a predetermined address signal contained in the input address, a defect relief circuit selects one of the redundant word lines in place of the faulty word line.

20 Claims, 16 Drawing Sheets

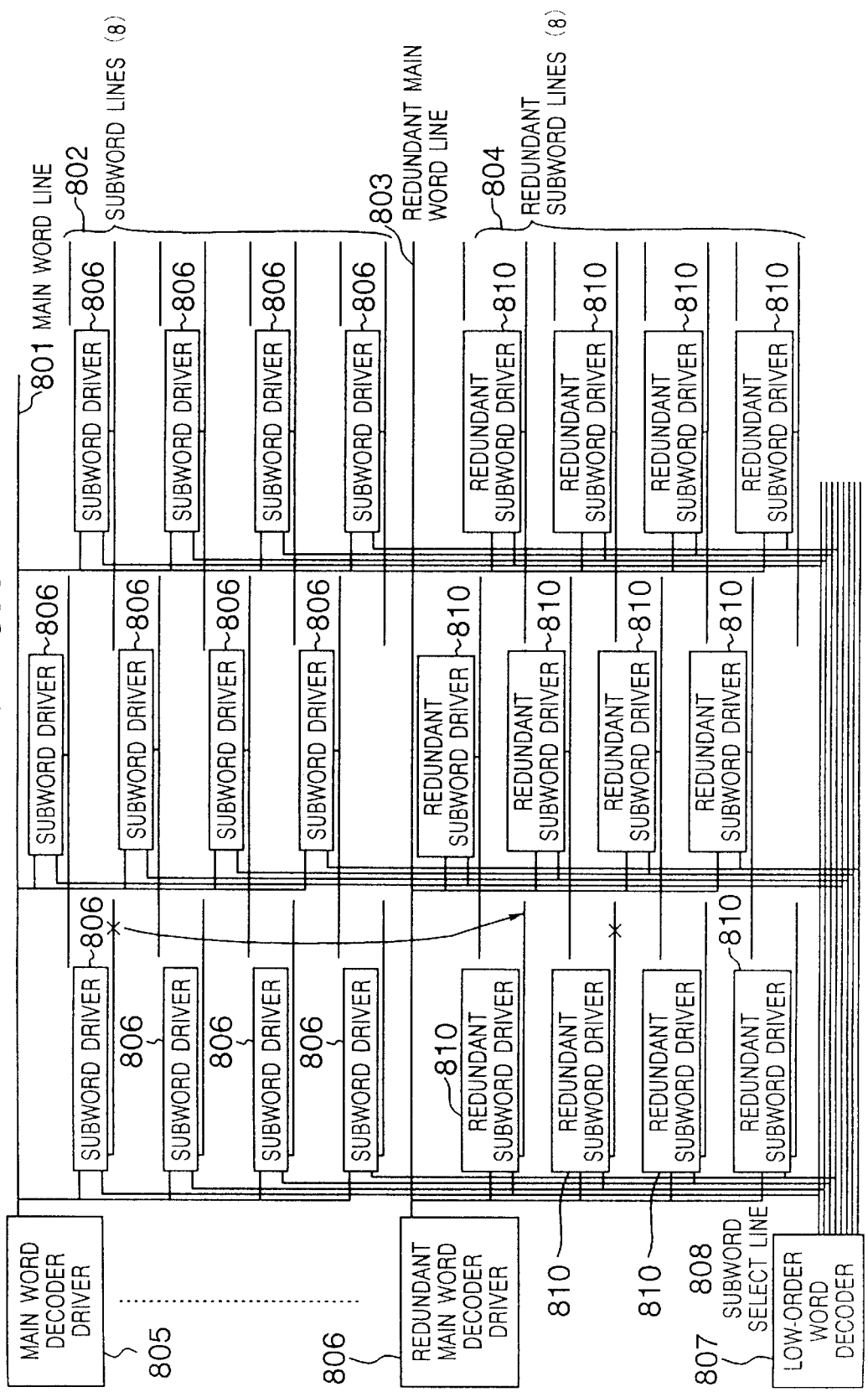

FIG. 13A

| RELIEF UNIT | LEAST SIGNIFICANT 2 BITS OF FAULTY ADDRESS | | LOW–ORDER ADDRESS BURNT OUT FUSE NO. | | | |
|---|---|---|---|---|---|---|
| | A0 | A1 | 1 | 2 | 3 | 4 |
| 4 WORD LINE | — | — |  | BURNT OUT | BURNT OUT | BURNT OUT |
| 2 WORD LINE | L | — |  | BURNT OUT | BURNT OUT | BURNT OUT |
| 2 WORD LINE | H | — | BURNT OUT |  | BURNT OUT | BURNT OUT |
| 1 WORD LINE | L | L |  | BURNT OUT | BURNT OUT | BURNT OUT |
| 1 WORD LINE | H | L | BURNT OUT |  | BURNT OUT | BURNT OUT |
| 1 WORD LINE | L | H | BURNT OUT | BURNT OUT |  | BURNT OUT |
| 1 WORD LINE | H | H | BURNT OUT | BURNT OUT | BURNT OUT |  |

FIG. 13B

| A0 | A1 | A2 | FXi | SWLi |
|----|----|----|-----|------|
| H  | H  | H  | FX0 | SWL0 |
| L  | H  | H  | FX1 | SWL1 |
| H  | L  | H  | FX2 | SWL2 |
| L  | L  | H  | FX3 | SWL3 |
| H  | H  | L  | FX4 | SWL4 |
| L  | H  | L  | FX5 | SWL5 |
| H  | L  | L  | FX6 | SWL6 |
| L  | L  | L  | FX7 | SWL7 |

5,862,086

SEMICONDUCTOR STORAGE DEVICE

CROSS-REFERENCE TO RELATED APPLICATIONS

The present application is relevant to U.S. patent application Ser. No. 08/679,724, filed by Jul. 12,1996 Yukihide Suzuki, Kahehide Kenmizaki, Tsugio Takahashi, Masayuki Nakamura, Makoto Saeki, Chisa Makimura, Katsuo Komatsuzaki and Shunichi Sukegawa, assigned to the present assignees, based on Japanese Patent Application No. 7-201674 filed on Jul. 14, 1995. The contents of that application are incorporated herein by reference.

BACKGROUND OF THE INVENTION

1. Field of the Invention

The present invention relates to a semiconductor storage device, and in particular to a defect relief technique effectively applicable to a dynamic RAM (random access memory) having a large storage capacity.

2. Description of the Related Art

In the case where a faulty address storage and an address comparator are provided for each redundant word line as a defect relief technique for a semiconductor storage device, an increased number of fuse circuits are undesirably required for storing faulty addresses corresponding to the respective redundant word lines. With a technique developed in an effort to overcome this disadvantage, a set of fuses is provided for a plurality of word lines. Such a plurality of word lines including a faulty word line are collectively switched to redundant word lines. With this configuration, therefore, a plurality of word lines are switched at a time. In this way, regardless of whether a fault occurs in a single or a plurality of word lines, the faults can be relieved by the fuse circuit. The overall relief efficiency, therefore, is improved.

Conventional techniques related to the present application are disclosed in JP-A-2-158995 and JP-A-61-20293.

SUMMARY OF THE INVENTION

An object of the present invention is to provide a semiconductor storage device having an improved defect relief efficiency with a simple configuration.

Another object of the invention is to provide a semiconductor storage device realizing an efficient defect relief in conformity with an increased storage capacity.

When a plurality of word lines are switched to redundant word lines as mentioned above, the particular group of redundant word lines which contain a defect themselves cannot be used as a replacement, whereby the defect relief efficiency is deteriorated.

A representative technique disclosed in the invention will be briefly described. Specifically, a semiconductor storage device according to the invention comprises a plurality of redundant word lines corresponding to a storage circuit for storing a faulty address. The storage circuit is adapted to store a faulty address required for selecting a redundant word line. This faulty address is compared with an address inputted at time of memory access. The resulting coincidence signal and a predetermined address signal contained in the input address are used to select a single redundant word line from among the plural redundant word lines in place of the faulty word line.

With the above-mentioned technique, a plurality of redundant word lines are associated with a storage circuit for a faulty address. The storage circuits are thus reduced in number, and the word lines are switched to redundant ones only at the time of memory access to a faulty word line. Even in the presence of a fault on a redundant word line, therefore, the redundant word line group containing the particular redundant word line can be used on condition that the address for designating one of a plurality of redundant word lines is differentiated. The defect relief efficiency thus is improved.

The effect of a representative technique according to the invention will be briefly described. Specifically, a plurality of redundant word lines are provided for a storage circuit storing a faulty address, and the storage circuit is adapted to store a faulty address required for selection of a word line. This faulty address is compared with an address input at the time of memory access. The resulting coincidence signal and a predetermined address signal contained in the input address are used to select one of a plurality of redundant word lines to replace the faulty word line. The number of storage circuits thus can be reduced by providing a plurality of redundant word lines for a storage circuit storing a faulty address. At the same time, even when a group of redundant word lines is found faulty, they can still be used on condition that the address designating one of the redundant word lines is differentiated. Thus the defect relief efficiency is improved.

The storage circuit and the comparator circuit may have the function of substantially invalidating predetermined address signals for faulty addresses designating a plurality of redundant word lines, and hence the function of relieving a plurality of corresponding faulty word lines. Relief of a plurality of defects are thus made possible.

The word lines include a main word line and a plurality of subword lines with the length thereof divided along the same direction as the main word line. The subword lines are arranged along a plurality of bit lines crossing the main word line and connected with dynamic memory cells. The subword lines are driven by a subword driver activated in response to a main word line selection signal and a selection signal supplied from a plurality of subword selection lines extending in the direction perpendicular to the subword lines. The redundant word lines include a main word line and a plurality of subword lines. The defect relief thus can be carried out efficiently while at the same time increasing the storage capacity.

A plurality of defect relief circuits each including a storage circuit and a comparator circuit may be arranged by being distributed in a plurality of memory mats. Each defect relief circuit is adapted to relieve a faulty word line in an associated memory mat. The defect relief efficiency thus is improved.

A storage circuit for storing a faulty address and a comparator circuit include a plurality of MOSFETs each having the gate thereof supplied with complementary, inverted and non-inverted address signals for designating one word line and the source thereof connected to a reference potential, and a plurality of fuse means each having an end thereof connected to the drain of a MOSFET. When a faulty address is stored, one of the fuse means corresponding to the non-inverted or inverted address signal is burnt out. The other ends of the respective fuse means are integrated to produce a wired logic signal. In this way, a variety for defect relief is made possible according to the manner in which fuses are burned out with a simple configuration.

The word lines include a main word line and eight subword lines. One of the four subword lines is selected by addresses A0 and A1. A fuse member of one of the two pairs of fuses corresponding to addresses A1 and A0 is burnt out to relieve one line. Both fuse members of one of the two fuse pairs corresponding to address A0 or A1 are burnt out to relieve two word lines. All fuses of the two pairs corresponding to addresses A0 and A1 are burnt out to relieve four word lines. In this way, defects can be relieved in a variety of manners.

BRIEF DESCRIPTION OF THE DRAWINGS

FIGS. 8A, 8B are schematic diagrams showing a configuration for explaining the relation between regular word lines and redundant word lines of a dynamic RAM according to the invention.

FIG. 13A is a diagram showing the fuse burnt-off state for explaining the defect relief operation of the fuse set shown in FIG. 12.

FIG. 13B is a diagram showing the relation between an address signal and a subword selection line.

DESCRIPTION OF THE PREFERRED EMBODIMENTS

Figure 1:
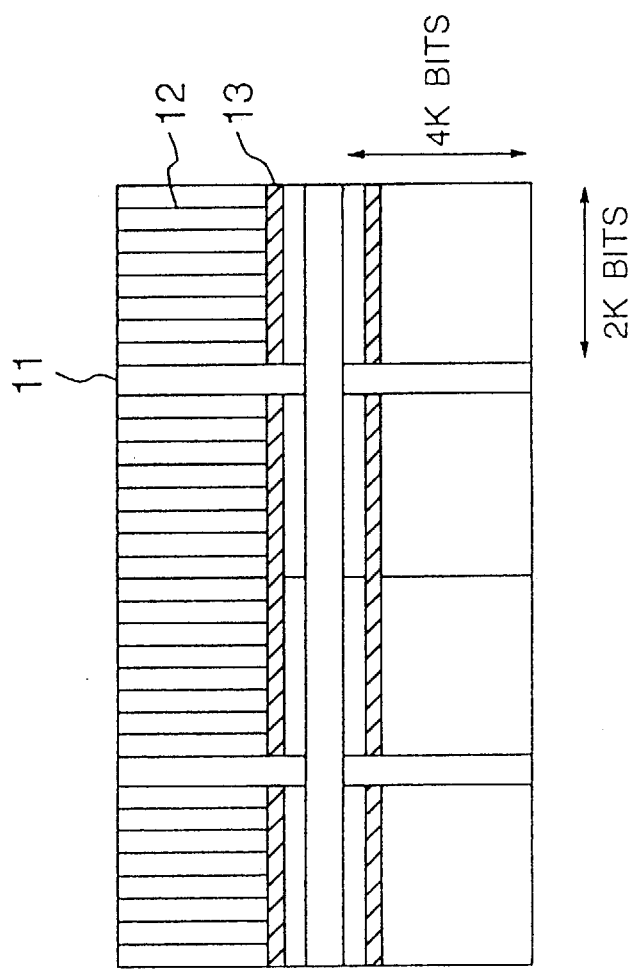
FIG. 1 is a layout schematically showing a dynamic RAM according to an embodiment of the invention.

A layout of a dynamic RAM according to an embodiment of the invention is shown in the schematic diagram of FIG. 1. In FIG. 1, the overall configuration of a plurality of circuit blocks constituting a dynamic RAM is shown in an easy to understand manner. These components are formed on a single semiconductor substrate like single-crystal silicon by a well-known fabrication technique for semiconductor integrated circuits.

The dynamic RAM according to this embodiment, though not specifically limited, is designed to have a storage capacity of about 64M (mega) bits. The memory array is divided into eight blocks. The memory array of the semiconductor chip is divided into four memory blocks on each side of a longitudinal central part where input/output interface circuits such as an address input circuit and a data input/output circuit (not shown) are formed.

The blocks of the memory array, which are divided into four blocks on each side along the longitudinal direction of a semiconductor chip as described above, are arranged in sets of two. A main word driver 11 is arranged between the blocks of each set. Each main word driver 11 corresponds to two memory array sections including upper and lower memory array sections associated with the particular main word driver 11. The main word driver 11 produces a signal for selecting a main word line extending through a memory array section. Each memory array block is constituted by a dynamic memory cell array having a storage capacity of 2K bits along the direction of the main word line and 4K bits along the direction of a perpendicular pair bit line (also called a data line) not shown. A total of eight similar memory array blocks are provided for a total memory capacity as large as 64M bits (=8×2K×4K).

Each memory array is divided into eight blocks along a main word line. A plurality of subword drivers 12 are provided for each of the memory blocks. Each subword driver has a length of one eighth of the main word line and forms a signal for selecting a subword line extending in parallel. According to this embodiment, in order to reduce the number of main word lines, i.e., in order to relax the wiring pitch of the main word lines, though not specifically limited, four subword lines are assigned to each main word line along the direction of the pair bit lines. A subword selection line driver 13 is arranged for selecting a single subword line from among the eight subword lines assigned along the direction of the pair bit lines. This subword selection line driver forms a selection signal for selecting one of the four subword selection lines extending along the direction of arrangement of the subword driver.

In the above-mentioned single memory array, a subword driver corresponding to one of the eight memory blocks assigned to each main word line containing a memory cell to be selected selects a subword selection line. As a result, a subword line is selected out of 32 (=8×4) subword lines associated with a single main word line. Since 2K (2048) memory cells are provided along the direction of the main word line as described above, each subword line is connected with 256 (=2048/8) memory cells. Thought not specifically limited, eight subword lines corresponding to a single main word line are selectable in the refresh operation (such as in self-refresh mode).

Figure 2:
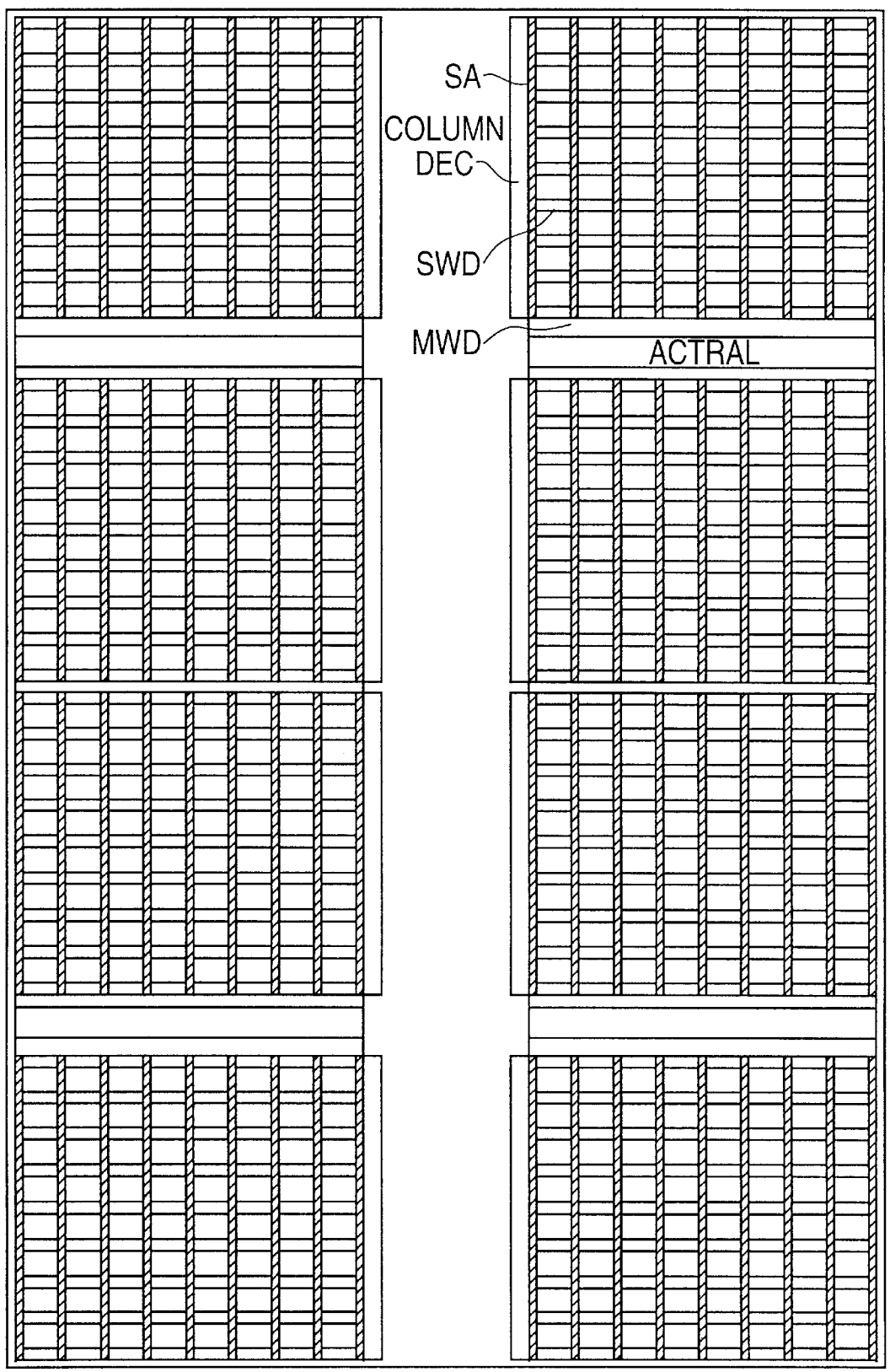
FIG. 2 is a layout showing the dynamic RAM of FIG. 1 according to an embodiment.

A layout of the same dynamic RAM according to an embodiment is shown in FIG. 2. In FIG. 2, in order to facilitate the understanding of the dynamic RAM according to the invention, an arrangement of sense amplifiers SA and column decoders making up the essential circuit blocks of what is called the column system is illustrated. In FIG. 2, MWD designates the main word driver described above, SWD a subword driver, SA a sense amplifier, and Column Dec a column decoder. ACTRL interposed between the two memory array blocks is an array control circuit for supplying a timing signal required for operation of the address decoder.

As described above, each memory array block has a storage capacity of as large as 4K bits along the direction of a pair bit line. If memory cells of as much as 4K bits is connected for each pair bit line, however, the parasitic capacitance of the pair bit line is increased to such an extent as to make it impossible to produce a signal level which otherwise might be read by the capacitance ratio with respect to a fine information memory capacitor. The memory array therefore is divided into eight blocks also along the direction of the pair bit line. In other words, the pair bit line is divided into eight segments by the sense amplifiers SA shown by thick solid lines. Though not specifically limited, as described later, the sense amplifiers SA are configured in a shared sense fashion. A pair bit line is arranged on each of the right and left sides of each of the sense amplifiers other than those arranged at the ends of the memory array. The sense amplifiers SA thus are connected selectively to one of the right and left pair bit lines.

Figures 3A, 3B:
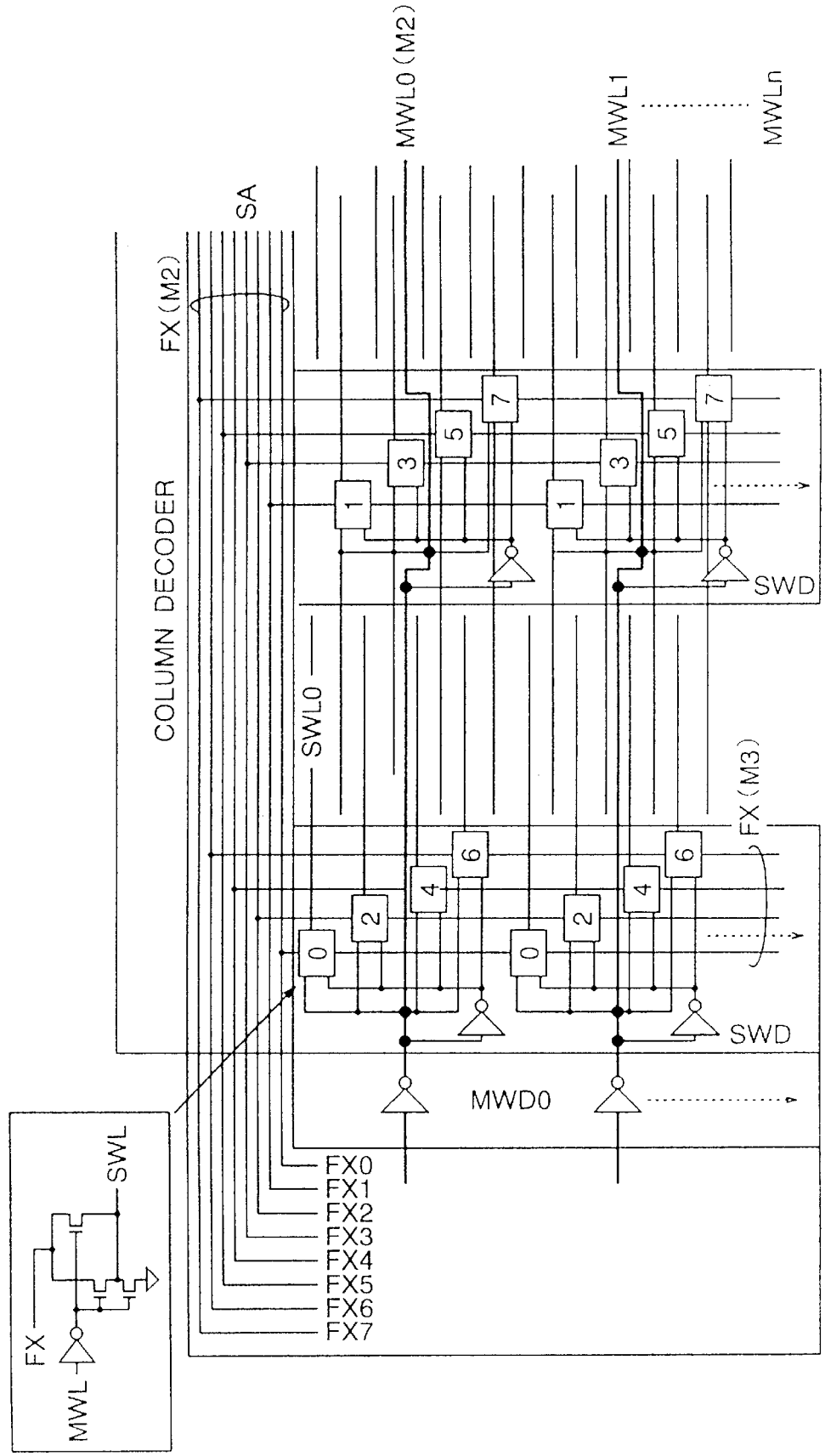
FIG. 3A is a block diagram showing the essential parts for explaining the relation between a main word line and subword lines in the memory array of FIG. 1 and FIG. 3B schematically illustrates the circuit construction of a subword driver of FIG. 3A

FIG. 3A is a block diagram showing the essential parts for explaining the relation between the main word lines and the subword lines of a memory array described above and FIG 3B schematically illustrates the construction of a subword driver with regard to the block diagram of FIG. 3A. In FIG. 3, two main word lines MWL0 and MWL1 are shown as a representative. The main word line MWL0 is selected by a main word driver MWD0. A similar main word driver is used to select the main word line MWL1.

The single main word line MWL0 has eight subword lines along the direction of extension thereof. FIG. 3A illustratively shows two subword lines as a representative thereof. A total of eight subword lines including even numbers 0 to 6 and odd numbers 1 to 7 are arranged alternately in a single memory block. Except for the even numbers 0 to 6 adjacent to a main word driver and the odd numbers 1 to 7 arranged at the far end of the main word line (on the side opposite to the word driver), the subword driver interposed between the memory blocks makes up a selection signal of the subword lines of the adjacent right and left memory blocks.

As a result, as described above, a memory array is divided into eight blocks. Substantially, however, the subword lines for two memory blocks are simultaneously selected by the subword driver. It follows therefore that the memory array is substantially divided into four blocks. In the above-mentioned configuration in which the subword lines are divided into the even numbers 0 to 6 and the odd numbers 1 to 7 with subword drivers arranged on the two sides of the memory block, the substantial pitch of the subword lines SWL arranged in high density according to the memory cell arrangement can be reduced by a factor of two in the subword driver. The subword drivers and the subword lines can thus be laid out efficiently.

The above-mentioned subword driver supplies a selection signal common to four subword lines 0 to 6 (1 to 7), and also, an inverted signal through an inverter circuit. Subword selection lines (selection signal lines) FX for selecting one of the four subword lines are provided. There are eight subword selection lines FX0 to FX7, of which the even-numbered lines FX0 to FX6 are supplied to the subword drivers (unit subword line selection circuits) 0 to 6 on the even-numbered lines. The odd-numbered lines FX1 to FX7, on the other hand, are supplied to the subword drivers (unit subword line selection circuits) 1 to 7 on the odd-numbered lines. Though not specifically limited, the subword selection lines FX0 to FX7 are formed of a metal wiring layer M2 in the second layer along the periphery of the array. The subword selection lines FX0 to FX7 are configured of a metal wiring layer M3 in the third layer at the crossing points with the main word lines MWL0 to MWLn composed of the second-layer metal wiring layer M2.

A first subword selection circuit is made up of a plurality of unit subword line selection circuits 0 to 7 coupled to the (first) main word line MWL0. A second subword line selection circuit is composed of a plurality of unit subword line selection circuits 0 to 7 coupled to the (second) main word line MWL1. The first subword line selection circuit is coupled with eight first subword lines, and the second subword line selection circuit is coupled with eight second subword lines.

Figure 4:
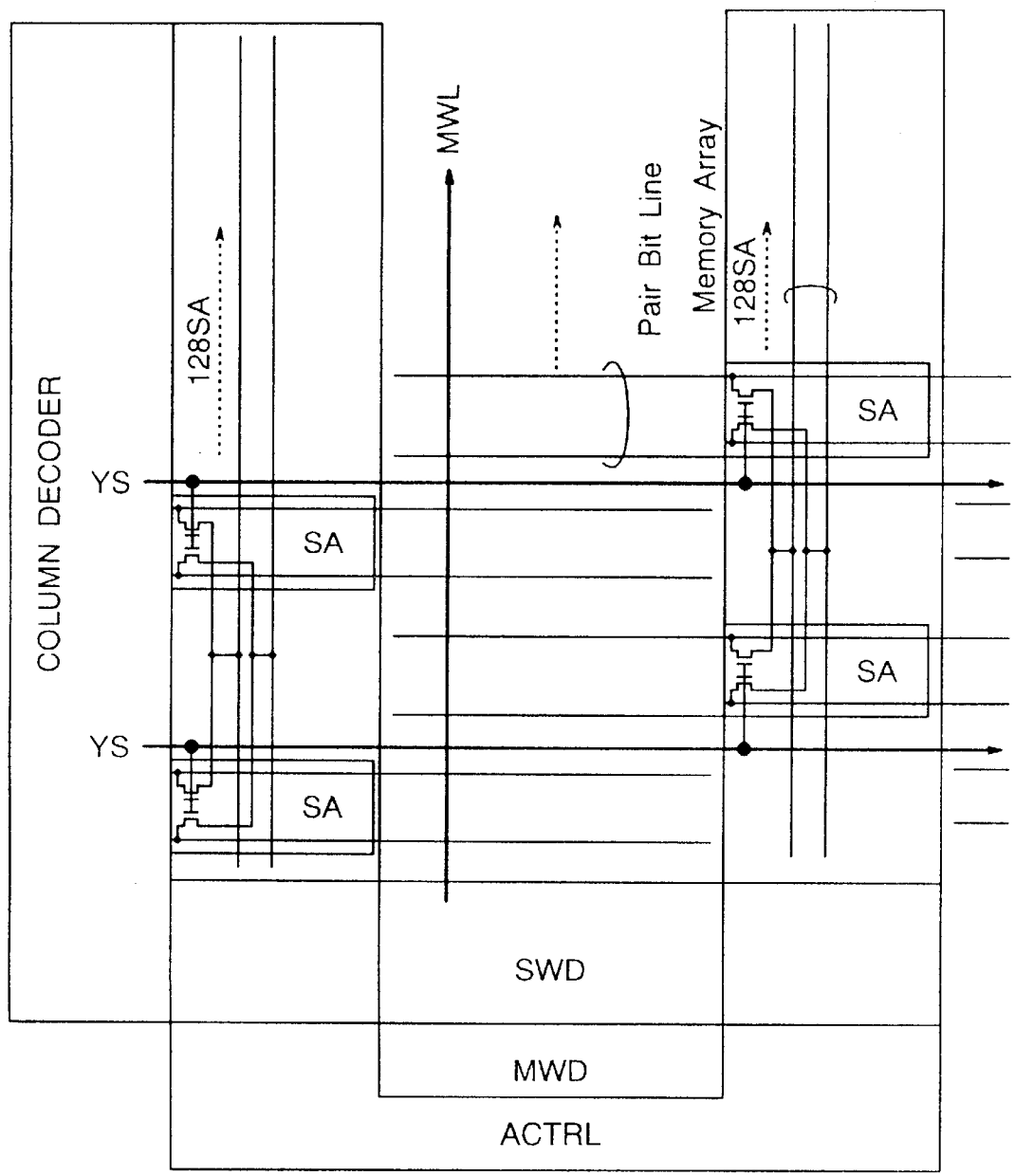
FIG. 4 is a block diagram showing the essential parts for explaining the relation between a main word line and sense amplifiers in the memory array of FIG. 1.

FIG. 4 is a block diagram showing the essential parts for explaining the relation between a main word line and sense amplifiers of the memory array described above. In FIG. 4, a main word line XWL is shown as a representative. This main word line MWL is selected by a main word driver MWD. A subword driver SWD corresponding to the even-numbered subword lines is provided adjacently to the main word driver.

Though not shown in FIG. 4, pair bit lines are arranged in orthogonal relation with the subword lines arranged in parallel with the main word line MWL. According to this embodiment, though not specifically limited, the pair bit lines are also divided into even-and odd-numbered lines, for which sense amplifiers SA are distributed in right and left parts of each memory block (memory array). The sense amplifiers SA are of shared sense type. The sense amplifiers SA at an extreme end, however, have no pair bit line but are connected with a pair bit line through a shared switch MOSFET as described later.

As explained above, with a configuration in which sense amplifiers SA are distributed on the two sides of a memory block, the pair bit lines are also distributed between odd- and even-numbered lines. The pitches of the sense amplifiers can therefore be increased. In other words, the element area for forming sense amplifiers SA can be secured while arranging pair bit lines in high density. Input/output lines are arranged along the sense amplifiers SA. These input/output lines are connected to the pair bit lines through column switches. Each column switch includes a switch MOSFET. The gate of the switch MOSFET is connected to a column selection line YS to which a selection signal of the column decoder is transmitted.

Figure 5:
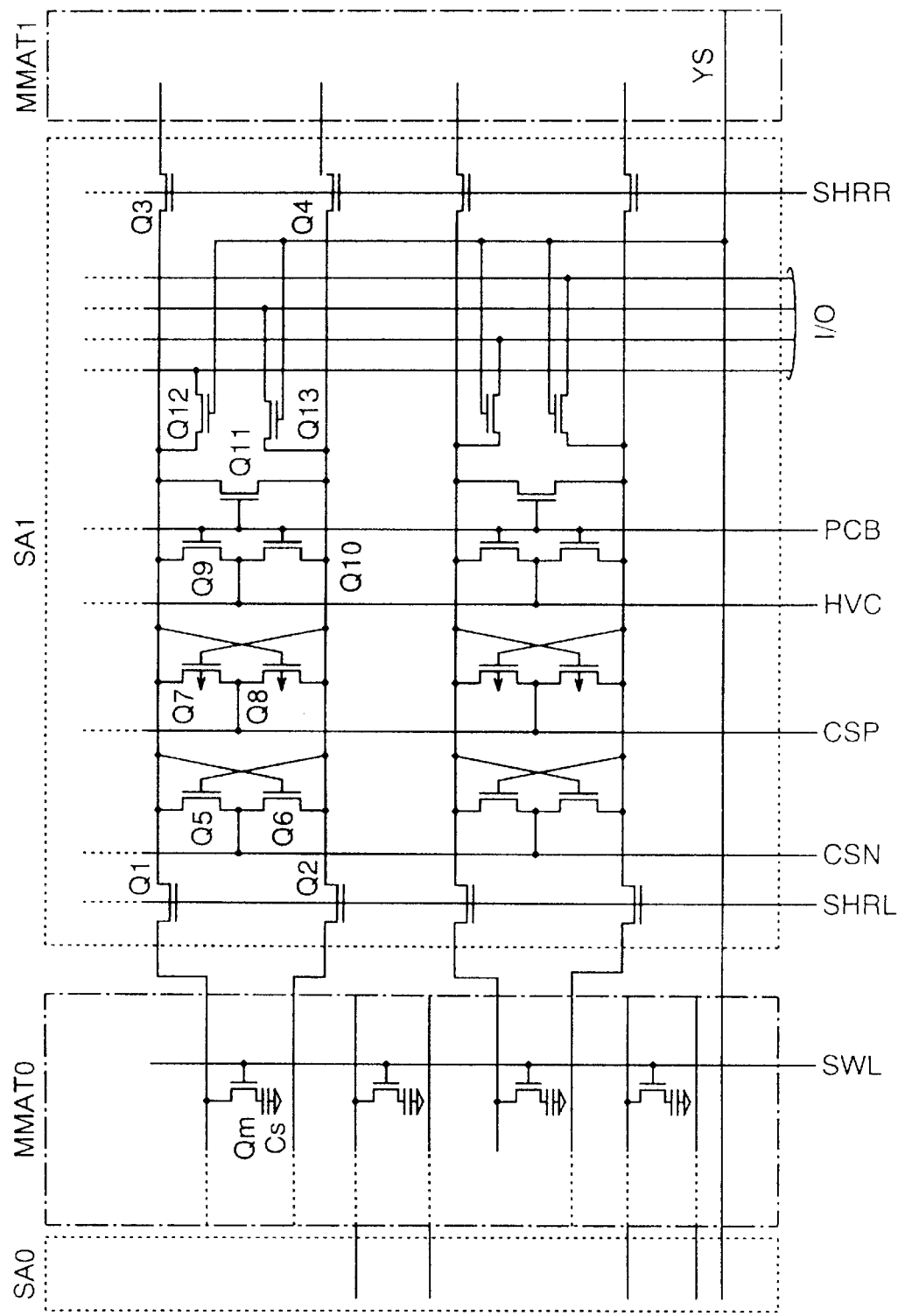
FIG. 5 is a circuit diagram showing the essential parts of a sense amplifier section of a dynamic RAM according to an embodiment of the invention.

FIG. 5 is a circuit diagram showing the essential parts of a sense amplifier of a dynamic RAM according to an embodiment of the present invention. FIG. 5 illustratively shows a sense amplifier SA1 interposed between memory mats (identical to the memory blocks mentioned above) MAT0 and MAT1 and associated circuits. The memory mat MAT1 is shown as a black box, and so is the sense amplifier SA0 at the left end.

Four dynamic memory cells are illustratively shown as the ones corresponding to the subword line SWL provided on the memory mat MMAT0. Each dynamic memory cell includes an address selection MOSFET Qm and an information-storing capacitor Cs. The gate of the address selection MOSFET Qm is connected to a subword line SWL, and the drain of the MOSFET Qm is connected to the bit line. The source of the address selection MOSFET Qm is connected with an information storage capacitor Cs. The other electrode of the information storage capacitor Cs is shared and supplied with a plate voltage.

A couple of pair bit lines are arranged in parallel as shown, and are appropriately crossed as required for effecting a balance between the capacitance of the bit lines. These pair bit lines are connected to the input/output nodes and to a unit sense amplifier circuit through the shared switches MOSFETs Q1 and Q2. The unit sense amplifier circuit includes N-channel MOSFETs Q5, Q6 and P-channel MOSFETs Q7, Q8 with the gates and the drains thereof crossed and latched. The sources of the N-channel MOSFETs Q5, Q6 are connected to a common source line CSN. The sources of the P-channel MOSFETs Q7, Q8 are connected to a common source line CSP. The common source lines CSN and CSP each have a power switch MOSFET of N-channel MOSFET and P-channel MOSFET, respectively. The power switch MOSFETs are turned on in response to a signal for activation of the sense amplifiers, and thereby supply a voltage required for the operation of the sense amplifiers.

Each of the power switches MOSFET for activating the sense amplifiers not shown includes two parallel-connected MOSFETs. In order to secure a stable sensing operation, the first power switch MOSFET is turned on to supply only a comparatively small current when the sense amplifier begins the amplification operation, and the second power switch MOSFET is turned on to supply a large current when the potential difference with the pair bit line reaches a predetermined magnitude due to the amplification operation of the sense amplifier. In this way, the amplification operation is performed in stages.

The input/output nodes of the unit sense circuit have a MOSFET Q11 for shorting the pair bit lines and a precharge circuit including switches MOSFETs Q9 and Q10 for supplying a half precharge voltage HVC to the pair bit lines. The gates of these MOSFETs Q9 to Q11 are supplied with a common precharge signal PCB.

The MOSFETs Q12 and Q13 constitute a column switch controlled by a column selection signal YS. According to this embodiment, four pairs of bit lines are selected by a single column selection signal YS. A sense amplifier SA0 indicated by a black box also has a similar column switch. As described above, the pair bit lines are divided into even-numbered bit lines and odd-numbered bit lines corresponding to the two sense amplifiers SA0 and SA1 on the two sides of the memory mat MMAT0. As a result, the column selection signal YS is adapted to select a total of four pair bit lines corresponding to two pairs of bit lines illustrated with the sense amplifier SA1 and two pairs of bit lines not shown associated with the sense amplifier SA0. Each of these two pairs of bit lines is connected to a common input/output line I/O through the above-mentioned column switch.

The sense amplifier SA1 is connected to pair bit lines on similar odd-numbered lines of the memory mat MMAT1 through shared switches MOSFETs Q3 and Q4. The pair bit lines on even-numbered lines of the memory mat MMAT1, on the other hand, are connected to the sense amplifier SA2 not shown arranged on the right side of the memory mat MMAT1 through shared switching MOSFETs corresponding to the shared switching-MOSFETs Q1 and Q2. In this repetitive pattern, the pair bit lines are connected to the sense amplifiers arranged between the memory mats (the above-mentioned memory blocks) into which the memory array is divided. In the case where the subword line SWL of the memory mat MMAT0 is selected, for example, the right shared switch MOSFET of the sense amplifier SA0 and the left shared switch MOSFET of the sense amplifier SA1 are turned on. The sense amplifier SA0 at the end, however, has only the right shared switch MOSFET. The signal SHRL is a left shared selection signal, and the signal SHRR is a right shared selection signal.

Figure 6A:
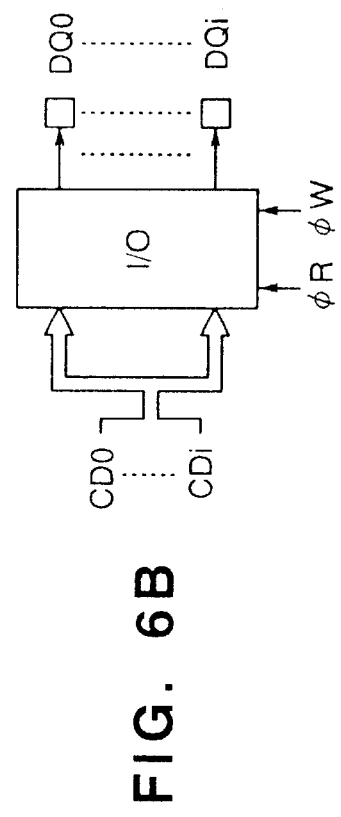
FIGS. 6A, 6B, 6C are block diagrams schematically showing the component parts adjacent to a dynamic RAM according to an embodiment of the invention.
Figure 6B:
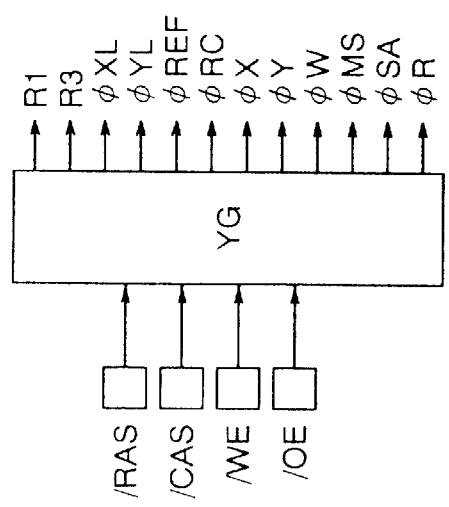
Figure 6C:
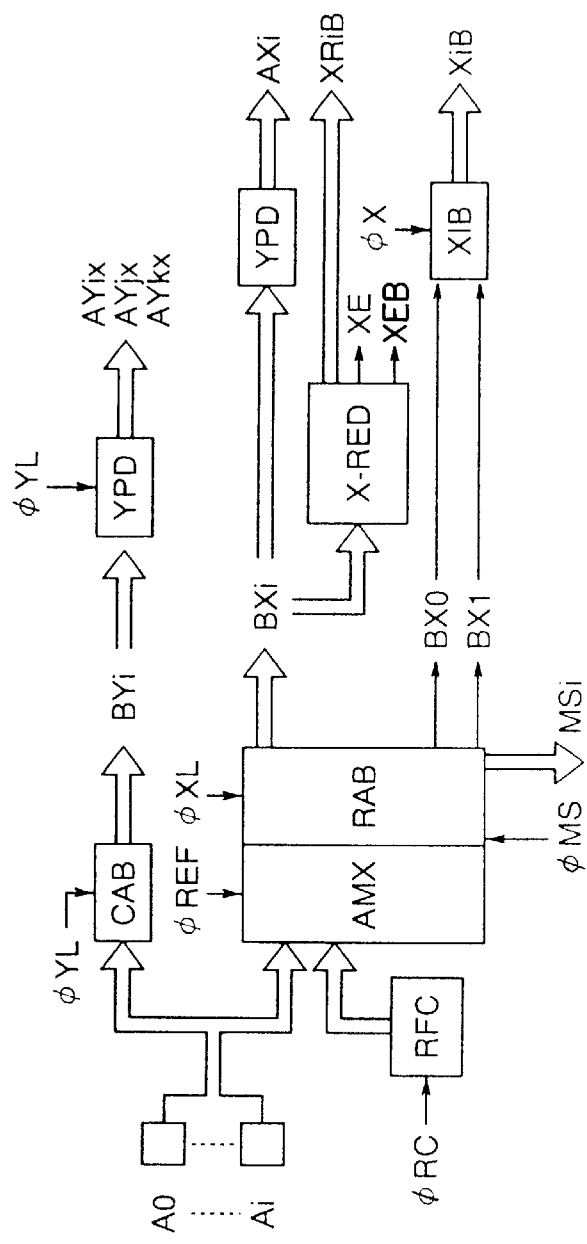

FIGS. 6A to 6C are block diagrams schematically showing the parts around a dynamic RAM according to an embodiment of the invention. A timing control circuit TG decides on an operation mode and forms various timing signals required for the operation of the internal circuits in conformance with the operation mode decision in response to a row address strobe signal /RAS, a column address strobe signal /CAS, a write enable signal /WE and an output enable signal /OE supplied from external terminals. In these specification and drawings, the character "/" is used for indicating that the low level is an active level.

Signals R1 and R3 are internal timing signals for the row system and used for selective operation of the row system. A timing signal $\phi$XL is one for fetching and holding a row-system address and is supplied to a row address buffer RAB. In other words, a row address buffer RAB fetches an address input from address terminals A0 to Ai by the timing signal $\phi$XL and has the address held in a latch circuit.

A timing signal $\phi$YL is for fetching and holding a column address and is supplied to a column address buffer CAB. In other words, the column address buffer CAB fetches an address input from the address terminals A0 to Ai by the timing signal $\phi$YL and has the address held in a latch circuit.

A signal $\phi$REF is generated in a refresh mode and is supplied to a multiplexer AMX in the input section of a row address buffer. This signal is controlled in a manner to be switched to a refresh address signal formed by a refresh address counter circuit RFC in refresh mode. The refresh address counter circuit RFE counts the refresh step pulse $\phi$RC formed by a timing control circuit TG and generates a refresh address signal. According to this embodiment, the auto-refresh and self-refresh functions are provided as described later.

A timing signal $\phi$X is a word line selection timing signal and is applied to a decoder XIB. Four different word line selection timing signals XiB are thus formed on the basis of the signal decoded from the two low-order bits of the address signal. A timing signal $\phi$Y is a column selection timing signal and is supplied to a column system predecoder YPD for outputting column selection signals AYix, AYjx and AYkx.

A timing signal $\phi$W is a control signal for designating a write operation, and a timing signal $\phi$R is a control signal for designating a read operation. These timing signals $\phi$W and $\phi$R are applied to an input/output circuit I/O. The input buffer included in the input/output circuit I/O is activated for a write operation thereby to set the output buffer in a high output impedance. For a read operation, on the other hand, the output buffer is activated thereby to set the input buffer in a high output impedance state.

A timing signal $\phi$MS, though not specifically limited, is for designating a memory array select operation. This signal is supplied to the row address buffer RAB, and a selection signal MSi is output in synchronism with this timing signal $\phi$MS. A timing signal $\phi$SA is for designating the operation of a sense amplifier. A pulse for activating a sense amplifier is formed on the basis of the timing signal $\phi$SA.

According to this embodiment, a row redundant circuit X-RED is illustratively shown as a representative circuit. Specifically, the circuit X-RED has the storage function of storing a faulty address and the function of comparing an address. The faulty address thus stored is compared with an internal address signal BXi output from the row address buffer RAB, and when they are not coincident with each other, a signal XE is raised to high level, while a signal XEB is reduced to low level, thereby validating the operation of the regular circuit. In the case where the internal address signal BXi input as above is coincident with the stored faulty address, the signal XE is reduced to low level, thereby prohibiting the selection operation of the faulty main word line of the regular circuit. At the same time, the signal XEB is raised to high level and a selection signal XRiB is output for selecting a spare main word line. A subword line in the spare main word line is selected using an address signal for selecting the subword line described above.

The defect relief according to the invention compares faulty addresses including one designating a faulty subword line among a plurality of subword lines associated with a main word line of the regular circuit. The feature of the invention, therefore, lies in the fact that the operation for selecting the main word line of the regular circuit is prohibited and a redundant main word line is selected by a redundant main word decoder only when a faulty subword line is accessed among a plurality of subword lines associated with the main word line of the regular circuit. Also, as described later, the fuse circuit has such a feature that the main word line and a plurality of subword lines associated with the main word line are switched to a spare main word line and spare subword lines, respectively, in case of any fault including a breakage or shorting of the main word line. In the case where a plurality but not all of the subword lines are faulty, the main word line and the subword lines are switched to the spare main word line and the subword lines, respectively, when the particular faulty subword lines are accessed.

Figure 7:
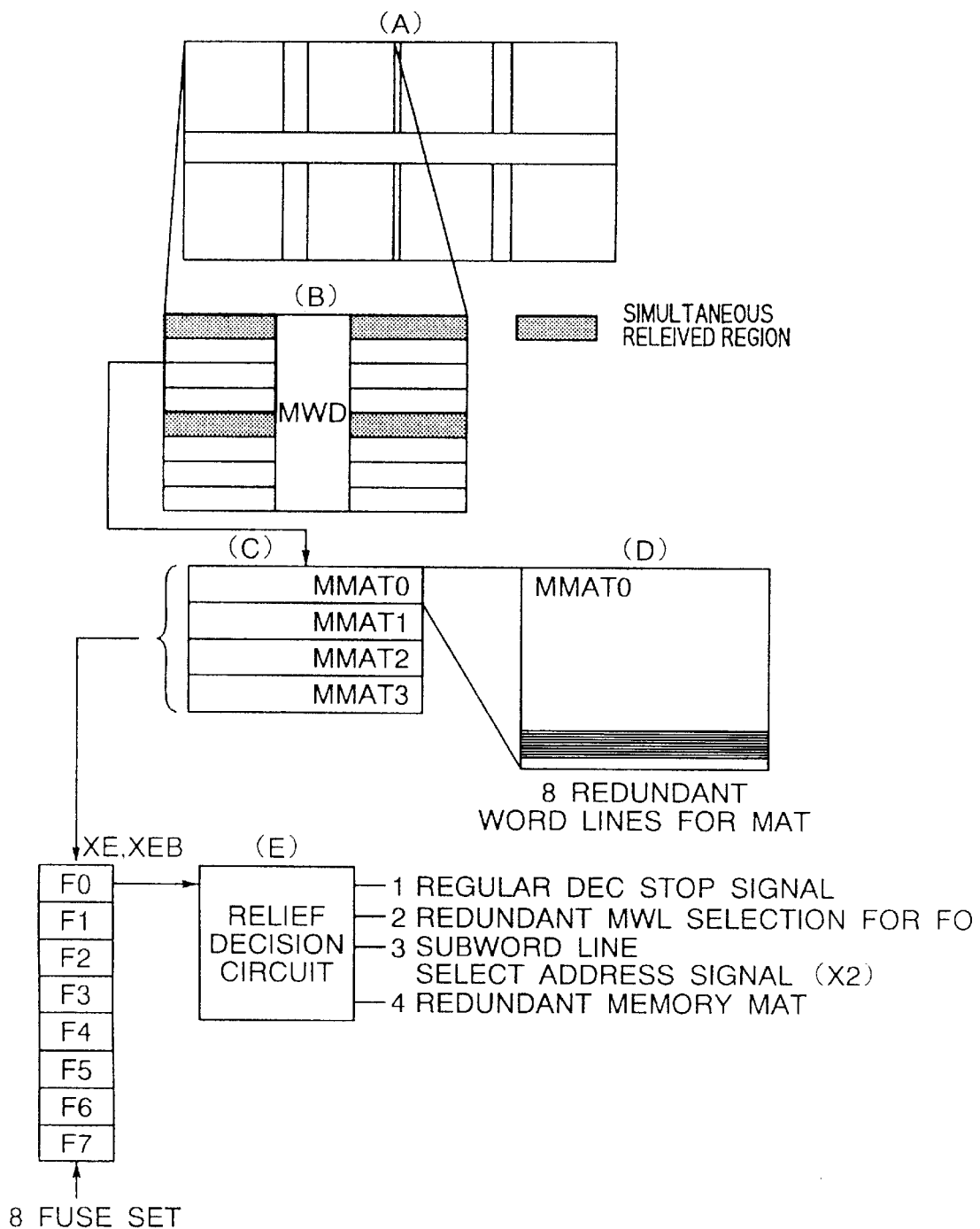
FIG. 7 is a schematic diagram showing a configuration for explaining a defect relief circuit incorporated in a dynamic RAM according to the invention.

FIG. 7 is a schematic diagram showing a configuration for explaining a defect relief circuit including a dynamic RAM according to the invention. FIG. 7A shows a general configuration of a semiconductor chip as shown in FIGS. 1 and 2. In other words, the whole of a semiconductor chip is divided into four memory blocks.

FIG. 7B shows a configuration of memory mats of one of the memory blocks into which the chip is divided. Eight memory mats are arranged on each side of a main word driver MWD. Of these memory mats, four memory mats MMAT0 to MMAT3 constitute one relief unit as shown in FIG. 7C. Eight redundant word lines are arranged as shown in each memory mat, as shown by the memory mat MMAT0 in FIG. 7D. In the dynamic RAM of this embodiment, as described above, eight subword lines are provided for each main word line. The eight redundant word lines described above, therefore, are each composed of one redundant main word line and eight redundant subword lines.

The four memory mats MMAT0 to MMAT3 described above are associated with eight fuse sets F0 to F7 as shown in FIG. 7E. The fuse set F0 typically illustrated in FIG. 7E includes a relief decision circuit. The fuse set F0 is adapted to generate and supply a detection signal (XE, XEB) to the relief decision circuit when the address signal input at the time of memory access coincides with the faulty address signal stored. In response to the detection signal, the relief decision circuit outputs signals 1 to 4. Signal 1 is a signal STOP for stopping the selection operation of the regular circuit. Signal 2 is used for selecting a redundant main word line assigned one-to-one with respect to the fuse set F0. Signal 3, on the other hand, is one corresponding to an address signal X2 for selecting a subword line and designates either the even-numbered subword drivers 0 to 6 or the odd-numbered subword drivers 1 to 7. Signal 4 is a selection signal for a memory mat having the redundant word lines (main word line and subword lines).

Table 1 shows the relationship between the detection signals due to the fuse sets F0 to F7 and signals 1 to 4. The detection signals (XE, XEB) are assigned labels RX00B to RX31B respectively corresponding to the fuse sets F0 to F7. Signal 1 generates a signal STOP for stopping the selection operation of the regular circuit and a selection signal MWSEL designating the selection of a redundant main word line in accordance with the detection signals RX00B to RX31B, respectively. The fuse sets F0 and F1 are each assigned to four redundant word lines (main word line and subword lines) on the memory mat MMAT0. The fuse set F0, therefore, generates a signal XS0 for selecting four of the eight subword lines, and the fuse set F1 generates a signal SX1 for selecting four of the eight subword lines. Since these subword lines are arranged on a single memory mat MMAT0, a corresponding mat selection signal MS0 is generated.

TABLE 1

| fuse set | detection signal | signal 1 | signal 2 | signal 3 | signal 4 |
|---|---|---|---|---|---|
| F0 | RX00B | STOP | MWSEL | XS0 | MS0 |
| F1 | RX01B | STOP | MWSEL | XS1 | MS0 |
| F2 | RX10B | STOP | MWSEL | XS0 | MS1 |
| F3 | RX11B | STOP | MWSEL | XS1 | MS1 |
| F4 | RX20B | STOP | MWSEL | XS0 | MS2 |
| F5 | RX21B | STOP | MWSEL | XS1 | MS2 |
| F6 | RX30B | STOP | MWSEL | XS0 | MS3 |
| F7 | RX31B | STOP | MWSEL | XS1 | MS3 |

In similar fashion, the fuse sets F2, F3 select redundant word lines corresponding to the memory mat MMAT1, the fuse sets F4, F5 select redundant word lines corresponding to the memory mat MMAT2, and the fuse sets F6, F7 select redundant word lines corresponding to the memory mat MMAT3. In such a case, the faulty word line to be relieved is associated with any one of the memory mats MMAT0 to MMAT3. In other words, what is called the any-to-any scheme of defect relief is possible in which the redundant word lines described above can be shared among the memory mats MMAT0 to MMAT3. A higher relief efficiency can thus be obtained as compared with the relief scheme implemented by memory mat.

FIG. 8A is a schematic diagram showing a configuration for explaining the relationship between the regular word lines and redundant word lines in a dynamic RAM according to the invention. The configuration of FIG. 8A illustratively includes one main word line 801 with corresponding eight subword lines 802, on the one hand, and one redundant main word line 803 with eight redundant subword lines 804 for relieving the lines 801, 802, on the other hand.

A main word decoder driver 805 forms a selection signal for a main word line by decoding an address signal. This main word line has eight subword lines which are selected by a subword driver 806. A low-order word decoder 807 forms a subword selection signal for selecting one subword line out of the eight subword lines described above. This subword selection signal is applied to the input of the subword driver through a subword selection line 808 extending across the main word line and the like. The subword driver has a logic function, and sets the subword line at the output thereof to a selection level when the main word line and the subword selection line are both at a selection level.

A redundant main word decoder driver 809 forms a selection signal for the redundant main word line. The redundant circuit, like the above-mentioned regular circuit, has eight redundant subword lines which are selected by a redundant subword driver 810 similar to the above-mentioned redundant subword driver. This redundant subword driver 810 sets the redundant subword line at the output thereof to a selection level when the redundant main word line and the subword selection line are both at a selection level.

According to this embodiment, as the mark X in FIG. 8A indicates, assume that one of the four subword lines is faulty and is accessed. The redundant main word decoder driver selects a redundant word line, and selects a redundant subword line through a redundant subword driver in response to a signal from the subword selection line. As a result, the fuse sets corresponding to the redundant word lines as described above are adapted to compare an address for selecting a subword line as well as to select a main word line. In the case where a main word line is selected and a subword line other than that marked with X is selected, therefore, the word lines are not switched.

In other words, according to this embodiment, the regular circuit is not switched to the redundant circuit and is not switched by main word line. Assume, for example, that a redundant subword line marked with X as shown among the four subword lines of the redundant word lines has a fault. An attempt to relieve the fault with four subword lines as a unit would fail due to the fault of the redundant subword line. According to this embodiment, by contrast, in spite of a partial fault of the redundant circuit as described above, defect relief is possible using a subword line other than those assigned the same low-order address as the faulty subword lines.

In addition, according to this invention, a fault which may occur in a plurality of subword lines among the four subword lines associated with the main word line can be relieved, as will be described later. In other words, the fuse set is designed to set a faulty address uniquely. Specifically, a predetermined one of the addresses supplied to the low-order word decoder is substantially invalidated, so that a memory access to the faulty subword lines is detected, thereby switching the regular word lines to the redundant main word line and the redundant subword lines. This finely detailed measure permits a few number of redundant circuits in a dynamic RAM to be efficiently used for an improved defect relief efficiency.

Figure 8B:
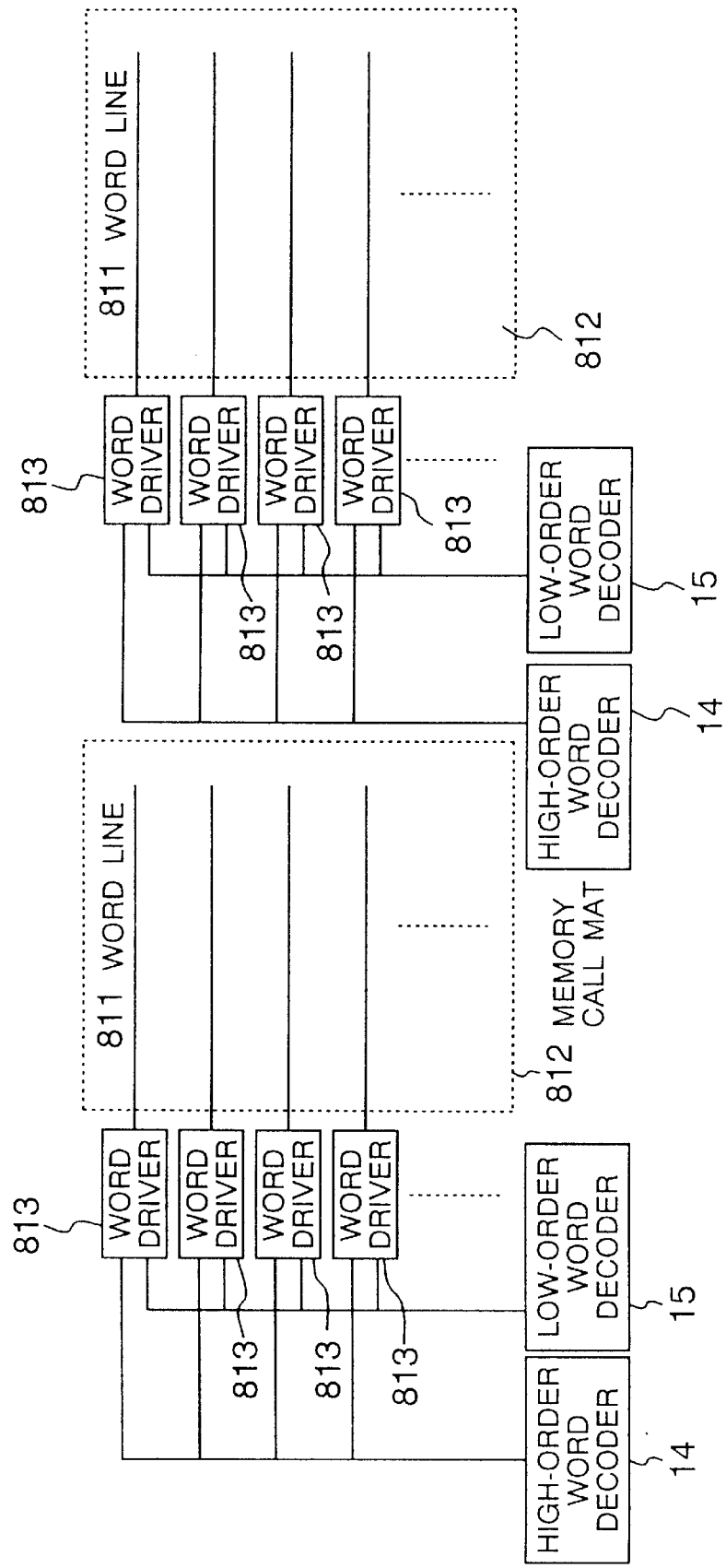

A memory (cell) mat configuration according to another embodiment is shown in FIG. 8B. The difference of FIG. 8B from FIG. 8A is that word lines are classified into main word lines 801 and subword lines 802 in FIG. 8A, whereas the word lines 811 in FIG. 8B are not so classified. In other words, in FIG. 8A, a main word line is formed longitudinally over the memory mat, and a plurality of subword lines having a plurality of memory cells coupled thereto are formed in divisions along the direction of the main word line. With the configuration of FIG. 8B, by contrast, a plurality of word lines including a plurality of memory cells coupled thereto are arranged longitudinally over the memory mat. In FIG. 8B, numeral 813 designates a word driver, numeral 814 a high-order word decoder, and numeral 815 a low-order word decoder.

Figure 9:
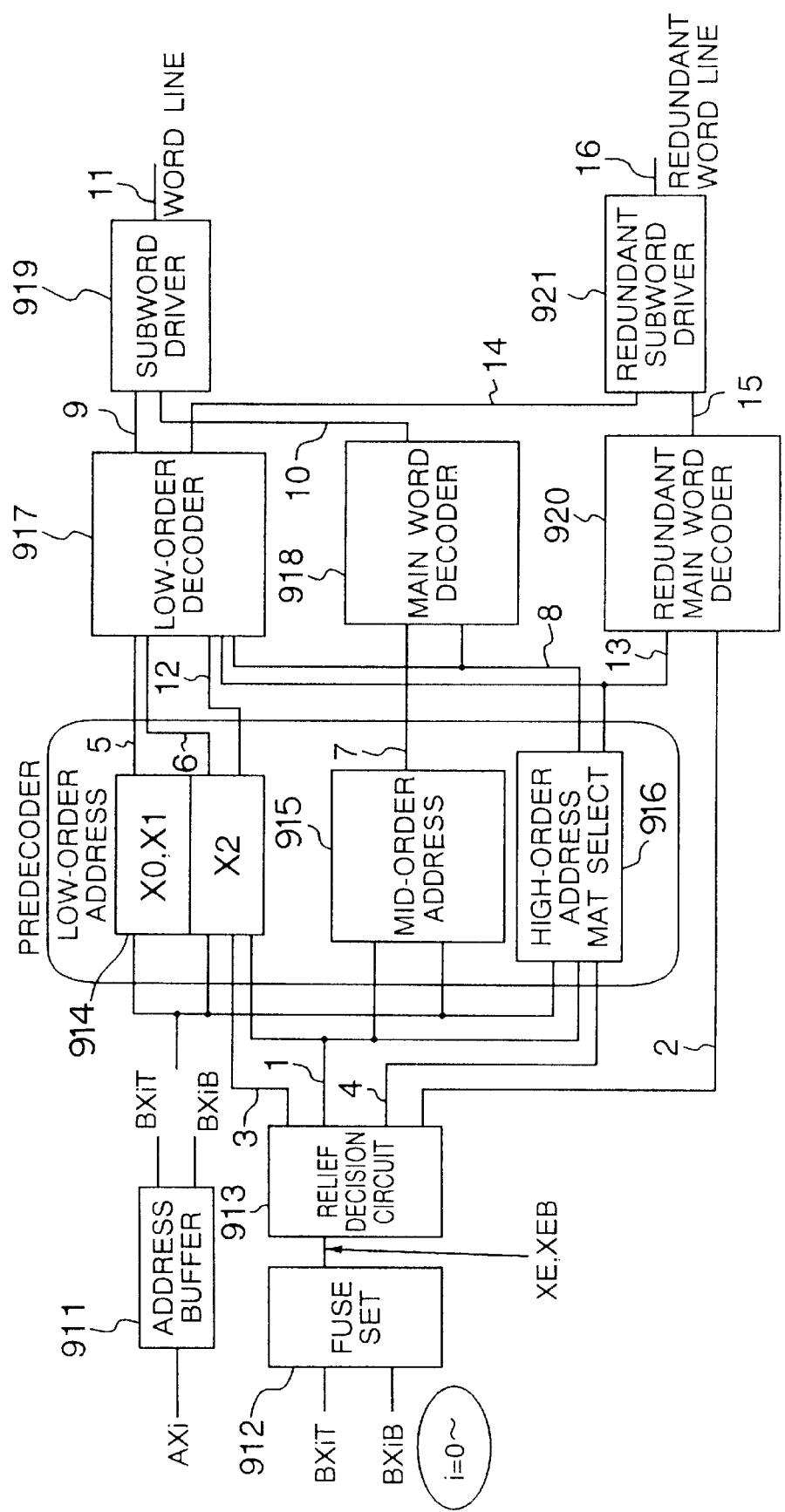
FIG. 9 is a schematic block diagram for explaining a defect relief circuit of a dynamic RAM according to the invention.

FIG. 9 is a schematic block diagram for explaining a defect relief circuit for a dynamic RAM according to the present invention. An address buffer 911 is supplied with an X address signal AXi. Character i designates a plurality of bits including 0. The address buffer 911 forms corresponding internal complementary address signals BXiT, BXiB. T designates true (non-inverted), and B a bar (inverted). A fuse set 912 is supplied with the internal complementary address signals BXiT, BXiB of all bits of the X addresses. As a result, in spite of the fact that the redundant circuit is arranged in units of four subword lines, even an address for designating an actually selected subword line is investigated.

A fuse set, a defect information hold circuit or a defect address storage circuit detects whether the subword line selected by memory access coincides with the subword line registered as faulty. A detection signal XE, XEB thus is generated and supplied to a relief decision circuit 913. The relief decision circuit 913 forms decision signals 1 to 4 shown in Table 1.

In the regular circuit, low-order addresses X0, X1, X2 in the internal complementary address signals BXiT, BXiB passed through the address buffer are applied to a low-order address predecoder 914. The low-order addresses X0, X1 are used for selecting four subword lines. The address X2 is used to select either subword drivers F0 to F3 or subword drivers F4 to F7, as shown in FIG. 3. A mid-order address predecoder 915 is supplied with an address corresponding to the main word line, and a high-order address predecoder 916 is supplied with an address corresponding to a mat select signal.

A low-order decoder 917 is adapted to form a signal 9 for selecting one of eight subword lines in response to subword line selection signals 5, 6 and a mat select signal 8 from the predecoder. A main word decoder 918 forms a main word line selection signal 10 in response to a main word line selection signal 7 and a mat select signal 8 from the predecoder. A subword driver or a subword line selection circuit 919 forms a selection signal 11 for a subword line 11 from the subword line selection signal (or a signal on the selection line) 9 and a main word line selection signal 10. The fuse set and the relief decision circuit constitute a control circuit (decision circuit).

The decision signal 1 among the four decision signals from the relief decision circuit is applied to the low-order address predecoder X2, the mid-order address predecoder and the high-order address predecoder, and upon detection of an access to a faulty address, stops the operation of these circuits. The decision signal (control signal) 2 is applied to a redundant main word decoder 920 as a signal for activating the redundant main word line. In other words, when the fuse set information coincides with the internal complementary address signals BXiT, BXiB, a decision signal (control signal) is output. The redundant main word decoder generates a redundant main word line selection signal 15. The decision signal 3 corresponds to and is supplied to the low-order address predecoder X2 for forming the odd- or even-numbered selection signal 12.

The low-order decoder forms a redundant subword line selection signal 14 using the address signals X0, X2 of the two low-order bits input by the memory access and signal 12 (corresponding to X2). As a consequence, a redundant subword driver (or a redundant decoder circuit or a redundant subword line selection circuit) 921 forms a selection signal for the redundant subword line 16 from the subword line selection signal 14 and the redundant main word line selection signal 15. The fuse set (defect information hold circuit) and the relief decision circuit constitute a decision circuit.

Figure 10:
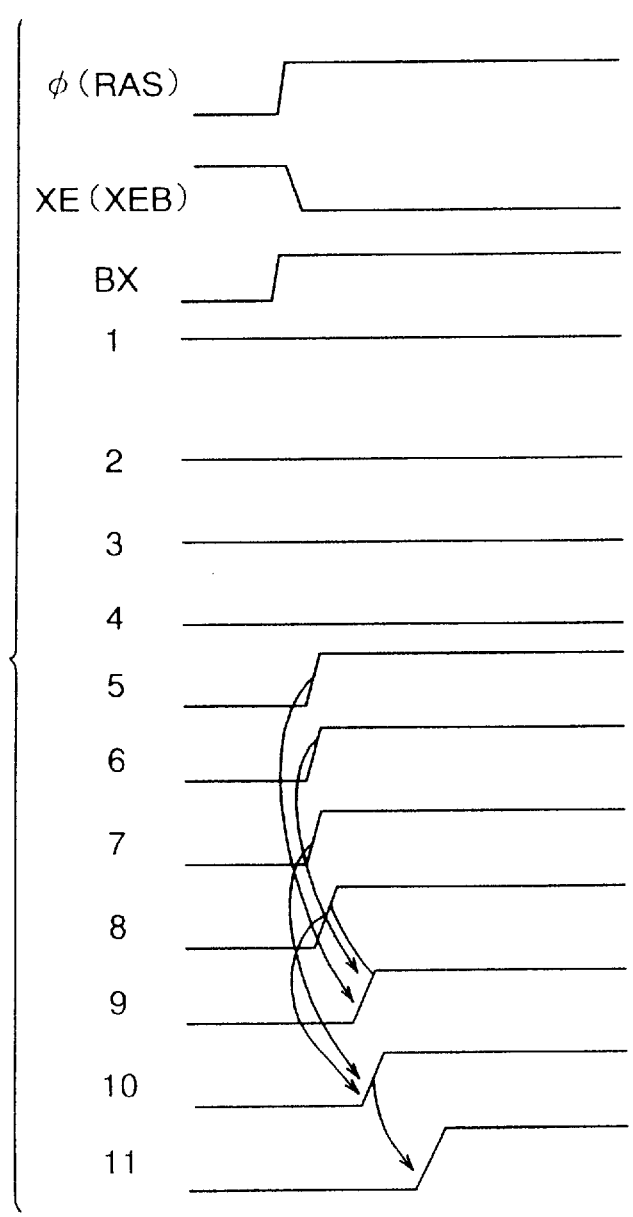
FIG. 10 is a timing chart for explaining an example operation of the defect relief circuit of FIG. 9.

FIG. 10 is a timing chart for explaining an example operation of the defect relief circuit shown in FIG. 9. An internal address signal BX is input in response to a row timing signal φ (RAS), so that a detection signal XE is reduced to low level in the absence of a memory access to a faulty address. As a result, signal 1 rises to high level, and signals 2 to 4 are reduced to low level, thereby inactivating the redundant circuit.

In the regular circuit, output signals 5, 6 of the low-order address predecoder and an output signal (mat selection signal) 8 of the high-order address predecoder are applied to the low-order decoder for forming a subword line selection signal 9. Also, in response to the mat selection signal 8 and the output signal 7 of the mid-order address predecoder, the main word decoder forms a main word line selection signal 10. These signals 9 and 10 cause the subword driver to form a selection signal for the subword line 11.

Figure 11:
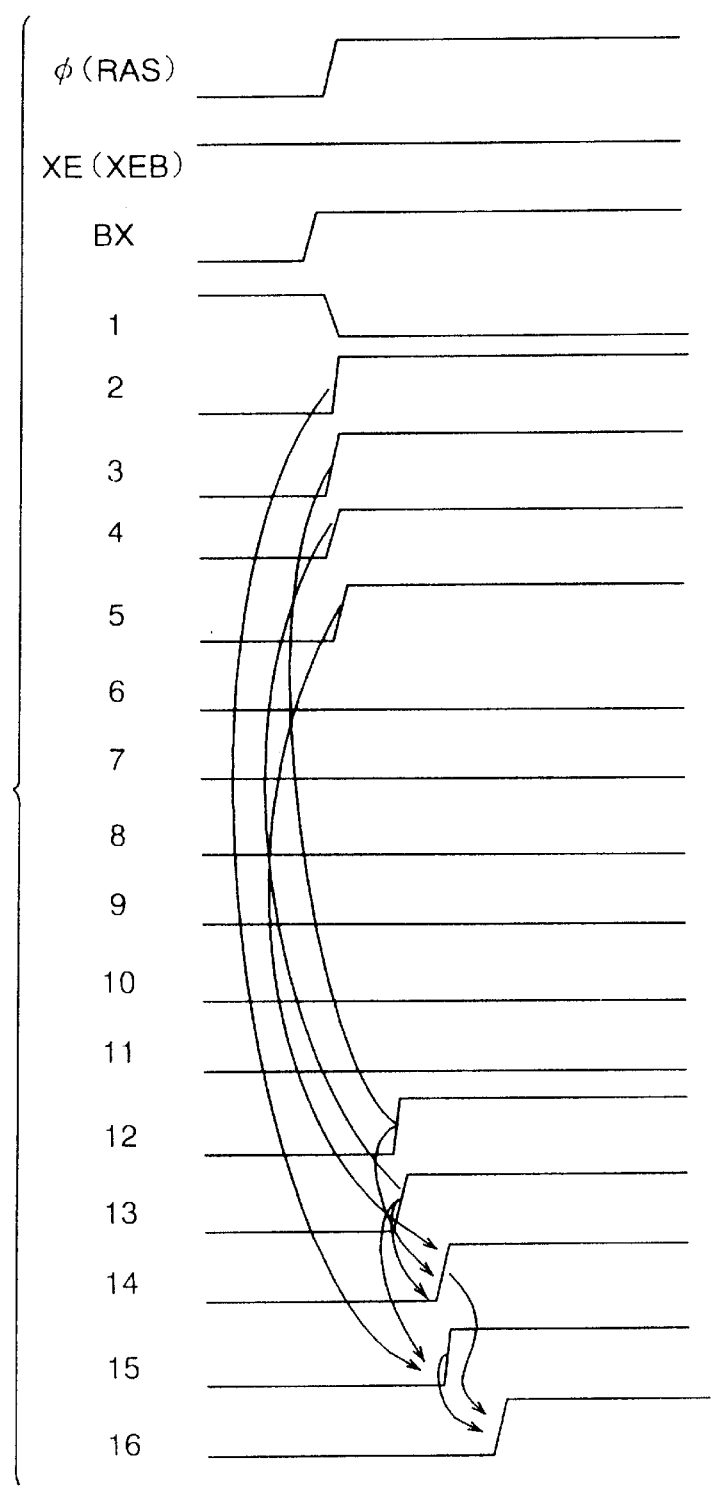
FIG. 11 is a timing chart for explaining another example operation of the defect relief circuit of FIG. 9.

FIG. 11 is a timing chart for explaining another example operation of the defect relief circuit of FIG. 9. In response to a row timing signal φ (RAS), an internal address signal BX is input, and in the presence of a memory access to a faulty address, the detection signal XE is raised to high level. As a result, signal 1 changes to low level and signals 2 to 4 to high level. The low level of signal 1 causes the regular circuit to be inactivated. In other words, signals 6 to 11 remain at low level.

Signal 12 corresponding to the low-order address X2 is formed by signal 3, and signal 13 corresponding to the mat select signal is formed by signal 4. In response to signal 12, signal 5 corresponding to the low-order addresses X0, X1 and signal 13 corresponding to the mat select signal, the low-order decoder forms a redundant subword line selection signal 14. The redundant main word decoder, on the other hand, generates a redundant main word line selection signal 15 in response to signal 2 and signal 13 corresponding to the mat select signal. In response to these signals 14 and 15, the redundant subword driver forms a selection signal for the redundant subword line 16.

Figure 12:
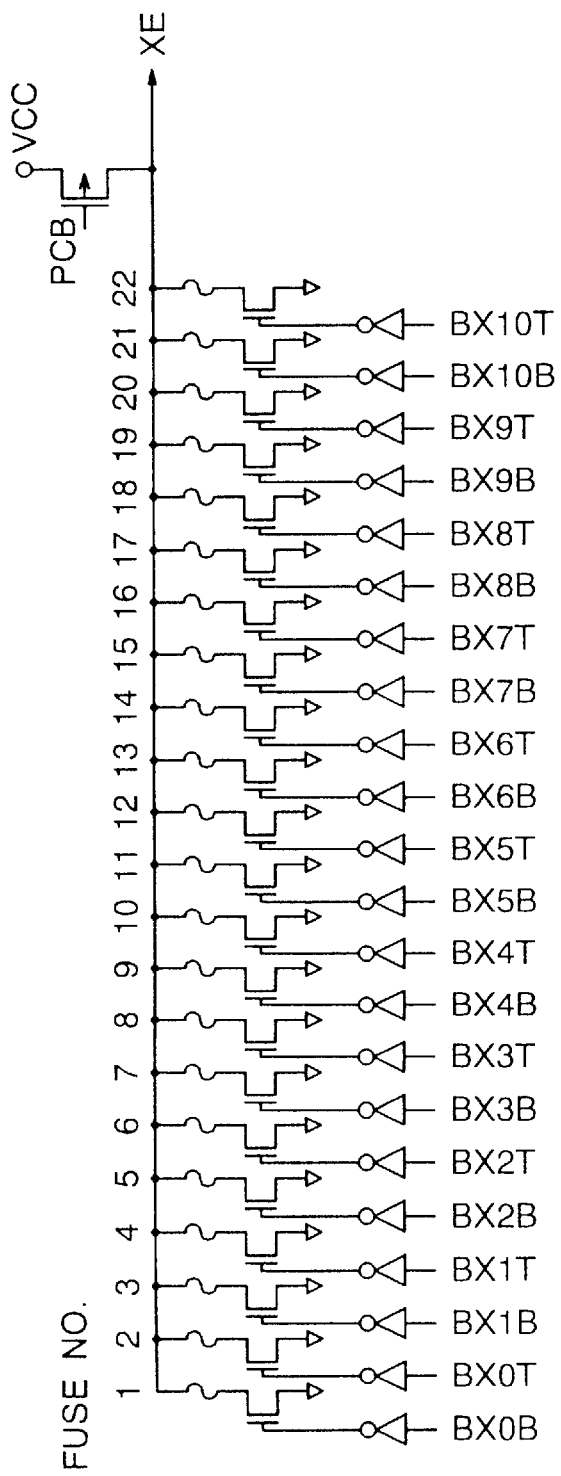
FIG. 12 is a circuit diagram of a fuse set used for the defect relief circuit of FIG. 7 according to an embodiment of the invention.

FIG. 12 is a circuit diagram showing a fuse set, a defect address storage circuit or a defect information hold circuit used with the defect relief circuit according to an embodiment. In this embodiment, one to 22 fuses are provided for 11-bit internal complementary address signals BX0B, BX0T to BX10B and BX10T. The internal complementary address signals BX0B, BX0T to BX10B and BX10T are supplied respectively to the gates of N-channel MOSFETs each through a CMOS inverter circuit as a buffer circuit. The sources of these MOSFETs are connected to the earth potential of the circuit, and the drains thereof are each connected to an end of the fuses 1 to 22, respectively. The other end of each of these fuses 1 to 22 is merged to take a wired-OR logic. The node thus merged constitutes a detection signal XE, and though not specifically limited, a P-channel MOSFET is provided which is activated by a precharge signal PCB.

The fuses, though not specifically limited, are made of a polysilicon layer, a conductive layer or a thin aluminum layer, and are selectively burnt out by irradiation of a laser beam or the like. This configuration may be replaced with equal effect by supplying a source voltage to the common node and supplying a breaking current through the MOSFET thereby to selectively burn out the fuses. In such a case, a breaking voltage is supplied from a voltage supply pad arranged at the common node at the time of programming, so that a faulty address is applied through an address buffer from a selection circuit for selecting one of the fuse sets. Any fuse set (defect address storage circuit) may be used as far as it is capable of holding the defect address information in nonvolatile fashion. For example, a mask ROM, EPROM, E²PROM, flash memory or a ferroelectric memory may be used as a defect address storage circuit.

According to this embodiment, the fuses are not burnt out unless a faulty address is set. For example, therefore, the internal complementary address signal BX0B or BX0T is reduced to low level with the N-channel MOSFET turned on, and the output node is discharged through fuse 1 or 2 not burnt out by the turned on state. The detection signal XE thus is reduced to low level, so that the switching to the redundant circuit is not effected as shown in the timing chart of FIG. 10. The fuses 5 to 22 (a plurality of first fuses) are capable of holding a first defect address (or first information) corresponding to the first address signals (BX2B, BX2T to BX10B, BX10T), while the fuses 1 to 4 (a plurality of second fuses) are capable of holding a second defect signal (or second information) corresponding to the second address signals (BX0B, BX0T, BX1B, BX1T).

When a faulty address is set, one of a pair of fuses 1 and 2 corresponding to the complementary address signals BX0B and BX0T associated with the least significant bit, for example, is burnt out. In the case where the least significant bit of the faulty address is logic 1, the true signal BX0T assumes high level, and the bar signal BX0B takes low level. In the process, not the fuse 2 but the fuse 1 which is associated with the bar signal BX0B is burnt out. Conversely, when the least significant bit of the faulty address is logic 0, the true signal BX0T assumes low level and the bar signal BX0B high level. In this case, not the fuse 1 but the fuse 2 which is associated with the true signal BX0T is burnt out. This is also the case with the fuse pairs corresponding to the remaining 10-bit internal complementary address signals BX1B, BX1T to BX10B, BX10T.

As described above, when the least significant bit of a faulty address is set to logic 1, i.e., when the fuse 1 is burnt out, assume that an address signal with a true signal BX0T at high level and a bar signal BX0B at low level is supplied in conformance with the burnt-out state of the fuse 1. The high level of the true signal BX0T turns the output of the inverter to low level, thereby turning off the MOSFET. The fuse 2 arranged at the drain of the MOSFET in off state is not burnt out as described above, and therefore no discharge path is formed. Since the bar signal BX0B is low, however, the output of the inverter assumes high level, thereby turning on the MOSFET. The fuse 1 arranged at the drain of the MOSFET thus turned on is burnt out, and therefore a discharge path is formed. In other words, in the case where the stored address coincides with the input address, a discharge path is not formed between the particular pair of fuses and a corresponding MOSFET.

As described above, when the least significant bit of a faulty address is set to logic 1, assume that an address signal with the true signal BX0T at low level and the bar signal BX0B at high level is supplied in disconformity with the logic 1 state of the least significant bit of the faulty address. The low level of the true signal BX0T causes the inverter output to turn to high level, thereby turning on the MOSFET. The fuse 2 at the drain of the MOSFET thus turned on is not burnt out as described above, and therefore a discharge path is formed with the result that the output signal XE is forcibly reduced to low level.

For each of the internal complementary address signals BX1B, BX1T to BX10B, BX10T, unless a discharge path is formed, the same address as the stored faulty address is determined to be input, so that the signal XE maintains a high level and provides a faulty address detection signal. With such a fuse set, the fuse itself assumes the dual function of providing a faulty address storage and comparison, and therefore the circuit is remarkably simplified. In addition, when a faulty address is not set, the fuse is not burnt out, thereby automatically preventing a coincidence signal from being formed. In the case where all the fuses 1 to 4 are burnt out, the internal complementary address signals BX0B, BX0T, BX1B and BX1T are ignored. In such a case, the control circuit including the fuse set is defined to be in a first state. Also, in the case where one of the fuses 1 and 2 and one of the fuses 3 and 4 are burnt out, the control circuit is defined to be in a second state.

In addition to this function, the device can be designed with a very convenient function of storing a plurality of faulty addresses and making comparison and decision on them. In other words, not only a faulty one of four subword lines associated with a single main word line as described above can be relieved, but also defect relief by two subword lines as a unit and defect relief by four subword lines as a unit are possible with storage and comparison performed by a single fuse set.

FIG. 13A shows a fuse in burnt-out state for explaining the above-mentioned three types of defect relief operations. The relief can be performed in three different units including four subword lines, two subword lines and one subword line. The low-order two bits A0 and A1 (corresponding to X0 and X1 respectively) of a faulty address and corresponding burnt-out states of the fuses 1 to 4 are described below.

For relief with four subword lines as a unit, the faulty addresses A0 and A1 are invalidated. In order to invalidate the faulty addresses A0 and A1, the fuses 1 to 4 are all burnt out. In this configuration, the discharge path is closed and the addresses A0 and A1 can be invalidated by the burning out of the fuses 1 to 4 regardless of the high or low level of the faulty addresses A0 and A1. In other words, by invalidating the addresses A0 and A1 of the low-order two bits, defect relief with four subword lines as a unit is effected. That is to say, when A2 is at high level, the four subword lines SWL0 to 3 corresponding to FX0 to 3 in FIG. 3 are relieved, while when A2 is at low level, the subword lines SWL4 to 7 corresponding to FX4 to 7 are relieved.

The defect relief with two subword lines as a unit invalidates the address A1 of the low-order two bits, and permits relief of a faulty address on each two subword lines designated by address A0. In other words, the fuses 3 and 4 corresponding to address A1 are both burnt out, while the fuse 1 or 2 is burnt out in association with address A0. In the case where the subword lines SWL0, SWL1, SWL" and SWL3 are designated by the addresses A0 and Al, for example, the address Al is invalidated. Thus the low level of the address A0 designates the subword lines SWL0 and SWL2, while the high level of address A0 designates the subword lines SWL1 and SWL3.

Though not shown in FIG. 13A, an alternative is to burn out both the fuses 1 and 2 to invalidate the least significant bit A0 and burn out one of the fuses 3 and 4 corresponding to address A1. In this case, the address A0 is invalidated and the low level of address A1 designates the subword lines SWL0 and SWL1, while the high level of the address A1 designates the subword lines SWL2 and SWL3. In this way, four combinations of two-subword units can be set in all.

The defect relief with a single subword as a unit validates both low-order addresses A0 and A1, and one of the fuse pairs 1, 2 and 3, 4 is burnt out in association with a faulty address. There are four combinations of two-bit addresses A0 and A1 as described above. In the fuse set according to this embodiment, three ways for relief are available with respect to nine faulty addresses. This is based on the assumption, however, that there are no faults in the redundant word lines including the redundant main word line and the redundant subword lines. In the case where there is a fault in the redundant word lines as described above, the redundant word lines can be used for defect relief on condition that the particular faulty redundant subword line is not used.

FIG. 13B shows which of eight subword selection lines FX0 to FX7 are selected and which of eight subword lines SWL0 to SWL7 are selected by combinations of the address signals of three bits A0, A1, A2.

Figure 14:
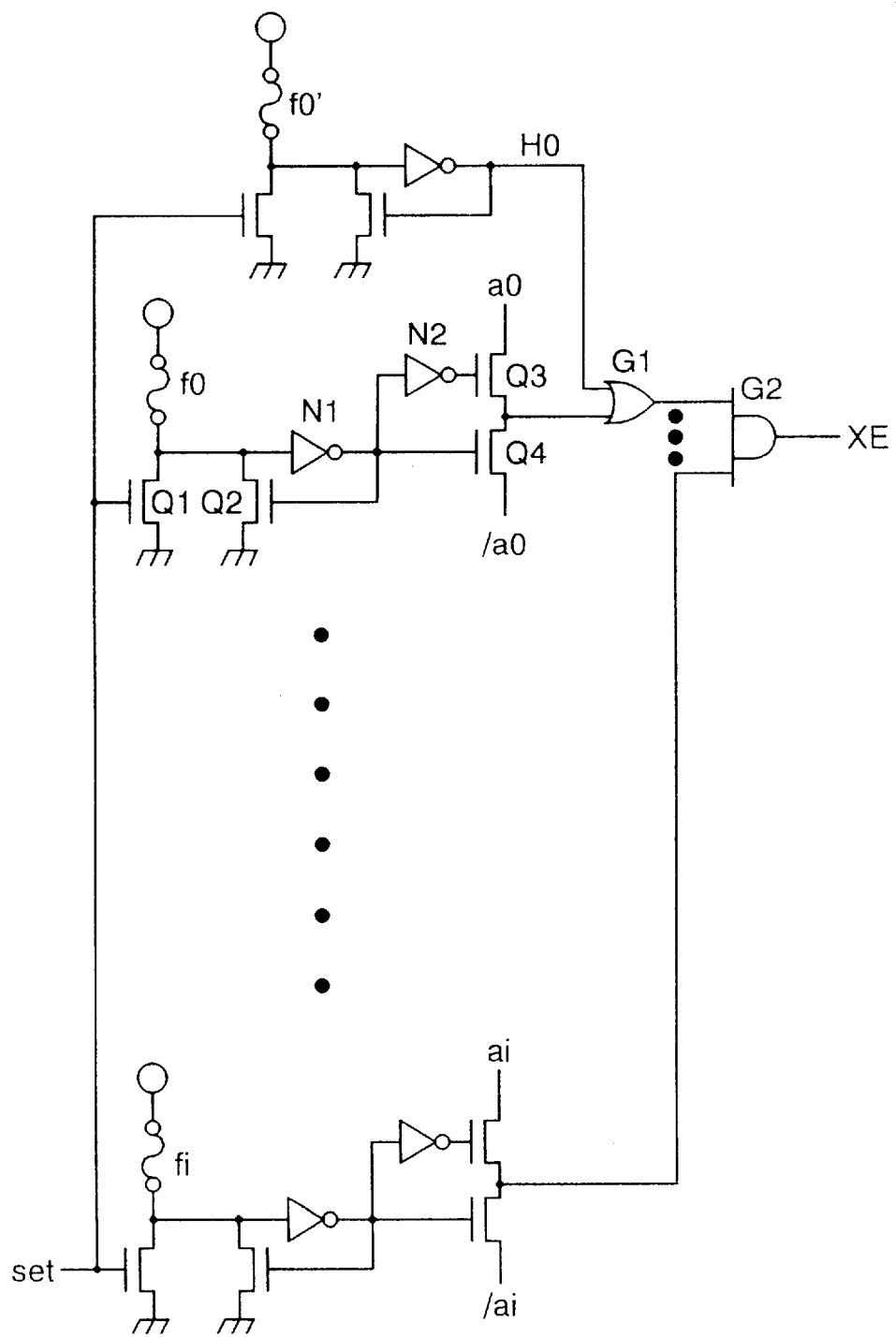
FIG. 14 is a diagram showing a defect relief circuit according to another embodiment of the invention.

FIG. 14 is a circuit diagram showing a defect relief circuit according to another embodiment of the invention. In this embodiment, a 1-bit faulty address is stored by one fuse. In other words, a signal formed by the presence or absence of burn-out state of the fuse f0 is applied through inverters N1 and N2 thereby to form non-inverted and inverted faulty address signals. When the fuse f0 is burnt out, for example, the set pulse generated at the time of power on turns on the MOSFET Q1. With the fuse f0 burnt out, a low-level signal is applied to the input of the inverter circuit N1, so that the output signal thereof assumes a high level. This high-level output signal is fed back to the gate of the MOSFET Q2 on the input side thereby to fix the input of the inverter N1 to low level. In the case where the fuse f0 is not burnt out, on the other hand, a high-level signal is formed and a low-level signal is output through the inverter N1 in view of the fact that the resistance value of the fuse f0 is smaller than the MOSFET Q1. In this way, unless the fuse f0 is burnt out, a high-level signal is applied to the input of the inverter N1 through the same fuse f0.

When the least significant bit A0 (X0) is set to logic 1, the fuse f0 is not burnt out but the output signal of the inverter N1 is reduced to low level and the output signal of the inverter N2 raised to high level. As a result, the MOSFET Q3, which constitutes a comparator circuit together with the MOSFET Q4 and corresponds to the high level output signal of the inverter N2, is turned on. This MOSFET Q3 is supplied with a high-level internal address signal a0 corresponding to the true signal from an address buffer. Consequently, once the same address as the least significant bit thus stored is supplied, a high-level coincidence signal is generated through the MOSFET Q3. If the internal address signal a0 is at low level, on the other hand, a low-level non-coincidence signal is generated through the MOSFET Q3.

The other MOSFET Q4 constituting the comparator circuit is supplied with an internal address signal /a0 constituting a bar signal. When the least significant bit A0 (X0) is set to logic 0, the fuse f0 is burnt out. The output signal of the inverter circuit N1 rises to high level and the output signal of the inverter N2 falls to low level. As a result, the MOSFET Q4 corresponding to the high level output signal of the inverter circuit N1, but not the MOSFET Q3 of the comparator circuit, is turned on. This MOSFET Q4 is supplied with a high-level internal address signal /a0 constituting the bar signal from the address buffer as described above. Once the same address is supplied as the least significant bit stored as above, therefore, a high-level coincidence signal is supplied through the MOSFET Q4. If the internal address signal /a0 is at low level, on the other hand, a low-level non-coincidence signal is output through the MOSFET Q4.

A similar circuit is provided also for other addresses. An AND gate circuit G2 is used to recognize that a coincidence signal has been generated for all the bits, thereby forming the decision signal XE. In order to realize defect relief with four subword lines, two subword lines or one subword line as a unit as in the case using fuse sets as illustrated above as a typical case, the comparator output section corresponding to the least significant bit has an OR gate circuit G1. The other input of this OR gate has a fuse circuit similar to the above-mentioned case. When the fuse f0' of this fuse circuit is burnt out, a high level invalid signal H0 is formed and applied to the other input terminal of the OR gate G1. In this configuration, the burning out of the fuse f0' outputs a high-level coincidence signal regardless of the address signal a0 or /a0 for the least significant bit corresponding to the fuse f0. As a result, it is possible to produce the same state as if the fuses 1 and 2 of the fuse set corresponding to the least significant bit are both burnt out, thereby making possible defect relief with two subword lines as a unit.

Though not shown in FIG. 14, if the comparator circuit associated with the address A1 includes an OR gate and a fuse circuit as in the previous case, the address A can also be invalidated. By burning out the two fuses, therefore, defect relief in four subword lines as a unit is possible. In this way, with a defect relief circuit including a storage circuit for storing a faulty address and a comparator circuit for comparing an address signal, a plurality of types of defect relief are realized, in the same manner as in the preceding case using fuse sets, by adding the function of invalidating an address designating a plurality of redundant word lines. Also, the fuse f0 and the like may alternatively be burnt out by a laser beam or by applying current from a MOSFET. In the latter case, a MOSFET for burning out the fuses is used.

The operational effects obtained from the foregoing embodiments are as follows:

(1) A plurality of redundant word lines are provided for a storage circuit for storing a faulty address, and the storage circuit is adapted to store a faulty address required for selecting a word line. A coincidence signal between the faulty address and an address input at the time of memory access and a predetermined address signal contained in the input address are used to select one of a plurality of redundant word lines to replace the faulty word line. Provision of a plurality of redundant word lines for a faulty address storage circuit can thus reduce the number of storage circuits. At the same time, even when a fault occurs in the redundant word lines, they can be used on condition that an address for designating one of the redundant word lines is differentiated. The defect relief efficiency can thus be improved.

(2) In the case where the storage circuit and the comparator circuit have the function to substantially invalidate the predetermined address signal associated with the faulty address and designating the redundant word lines and thereby to permit relief of the corresponding faulty word lines, then relief of a plurality of defects is possible.

(3) Assume that the word lines include a main word line and a plurality of subword lines each having a length divided along the extension of the main word line. The subword lines are arranged in the direction of the bit lines crossing the main word line and are connected with a plurality of dynamic memory cells. The subword lines are driven by a subword line driver supplied with a selection signal for the main word line and a selection signal from a plurality of subword selection lines extended along the direction perpendicular to the main word line. The redundant word lines include a main word line and a plurality of subword lines. In this way, the storage capacity can be increased and, at the same time, a highly efficient defect relief can be realized in conformity with the increased storage capacity.

(4) A plurality of defect relief circuits each including a storage circuit, a comparator circuit and redundant word lines are distributed among a plurality of memory mats, and each defect relief circuit is adapted to relieve a faulty word line in a corresponding memory mat. In this way, the defect relief efficiency can be improved.

(5) The storage circuit for storing a fault address and the comparator circuit include a plurality of MOSFETs each having the gate thereof supplied with complementary non-inverted and inverted address signals designating a word line and having the source thereof connected to a reference potential, and a plurality of fuse means with an end thereof connected to the drain of the MOSFET. When a faulty address is stored, one of the fuse means corresponding to the non-inverted or inverted address signal is burnt out, and the other ends of the fuse means are merged to produce a wired logic signal. In this way, a variety of defect reliefs due to various methods of burning out the fuses are made possible with a simple configuration.

(6) A plurality of word lines include a main word line and eight subword lines, in which one of four subword lines is selected by addresses A0 and A1. Relief with one subword line as a unit is effected by burning out one of the two fuses of each of the fuse pairs corresponding to the address A0 or A1. Relief with two subword lines as a unit is effected by burning out both the fuses of one of the two fuse pairs corresponding to the address A0 or A1. In addition, relief with by four subword lines as a unit is effected by burning out all the fuses of the two fuse pairs corresponding to the address signals A0 and A1. In this way, a variety of defect reliefs are possible.

Embodiments of the invention developed by the present inventors are described above. The invention is not confined to the embodiments described above, but can of course be modified in various ways to the extent not departing from the scope and spirit of the invention. For example, the word lines are not limited to those configured of a main word line and a plurality of subword lines, but may alternatively be provided for each memory mat. In other words, the word lines are not limited to a classified configuration in which the main word line includes subword lines but an unclassified word line configuration applies with equal effect. Also in the latter case, a plurality of redundant word lines are provided for a relief decision circuit including the fuse sets. Various modes of embodiments can thus be employed for the memory mat configuration and layout. The memory cell may be a static memory cell or a nonvolatile memory device in place of the dynamic memory cell. This invention is applicable widely to semiconductor storage devices comprising a defect relief circuit. Defect relief is possible with any number of units of word lines including $8, 16, \ldots, 2^n$ according to the invention. Defect relief by a main word line, by subword lines or by a combination of the main word and subword lines is possible according to the invention.

We claim:

1. A semiconductor storage device comprising:

a plurality of main word lines including a first main word line and a second main word line;

a plurality of subword lines including a plurality of first subword lines and a plurality of second subword lines;

a plurality of selection signal lines;

a plurality of subword line selection circuits including a first subword line selection circuit and a second subword line selection circuit;

a redundant main word line;

a plurality of redundant subword lines;

a redundant subword line selection circuit;

a plurality of memory cells coupled to said subword lines;

a plurality of redundant memory cells coupled to said redundant subword lines; and a decision circuit including a defect information hold circuit;

wherein said semiconductor storage device is supplied with a first address signal and a second address signal, said first subword line selection circuit is coupled to said selection signal lines, said first main word line and said first subword lines, said second subword line selection circuit is coupled to said selection signal lines, said second main word line and said second subword lines, said redundant subword line selection circuit is coupled to said selection signal lines, said redundant main word line and said redundant subword lines, and said decision circuit is supplied with said first address signal and said second address signal, said redundant main word line is selected and a selection signal based on said second address signal is applied to said selection signal line in the case where said defect information hold circuit holds first information and second information and in the case where said decision circuit decides that said first address signal coincides with said first information and that said second address signal coincides with said second information, one of said main word lines corresponding to said first address signal is selected and said selection signal based on said second address signal is applied to said selection signal line in the case where said defect information hold circuit holds said first information and said second information and in the case where said decision circuit decides that said first address signal coincides with said first information but that said second address signal fails to coincide with said second information, and said redundant main word line is selected and said selection signal based on said second address signal is applied to said selection signal line in the case where said defect information hold circuit holds said first information but not said second information and in the case where said decision circuit decides that said first address signal coincides with said first information.

2. A semiconductor storage device according to claim 1, wherein said first address signal is for selecting one of said main word lines.

3. A semiconductor storage device according to claim 2, wherein said second address signal is capable of selecting one of said first subword lines, one of said second subword lines and one of said redundant subword lines.

4. A semiconductor storage device according to claim 1, wherein said first address signal is used for selecting said main word lines, and said second address signal is used for selecting said subword lines and said redundant word lines.

5. A semiconductor storage device according to claim 1, wherein said defect information hold circuit includes a first information hold circuit for holding said first information in nonvolatile fashion and a second information hold circuit for holding said second information in nonvolatile fashion.

6. A semiconductor storage device according to claim 5, wherein said first information hold circuit includes a plurality of first fuses, and said second information hold circuit includes a plurality of second fuses.

7. A semiconductor storage device according to claim 6, wherein said defect information hold circuit fails to hold said second information in the case where said second fuses are in a predetermined state.

8. A semiconductor storage device according to claim 1, wherein said memory cells and said redundant memory cells are of dynamic type.

9. A semiconductor storage device comprising:

a plurality of word lines;

a plurality of memory cells coupled to said word lines;

a decoder circuit coupled to said word lines;

a plurality of redundant word lines;

a plurality of redundant memory cells coupled to said redundant word lines;

a redundant decoder circuit coupled to said redundant word lines; and a control circuit corresponding to said redundant word lines;

wherein said decoder circuit is supplied with a plurality of first address signals and a plurality of second address signals, said decoder circuit selects one of said word lines on the basis of said first address signals and said second address signals, said control circuit includes a first defect address storage circuit and a second defect address storage circuit and outputs a control signal, said first defect address storage circuit corresponds to said first address signals and is capable of holding a first defect address corresponding to said first address signals, said second defect address storage circuit corresponds to said second address signals and is capable of holding a second defect address corresponding to said second address signals, said control circuit outputs said control signal in the case where said control circuit is in a first state and said first address signals coincide with said first defect address signal held in said first defect address storage circuit, said control circuit outputs said control signal in the case where said control circuit is in a second state, said first address signals coincide with said first defect address held in said first defect address storage circuit, and said second address signals coincide with said second defect address held in said second defect address storage circuit, said redundant decoder circuit is supplied with said second address signals, and said redundant decoder circuit selects one of said redundant word lines on the basis of said second address signals upon receipt of said control signal from said control circuit.

10. A semiconductor storage device according to claim 9, wherein said first defect address storage circuit holds said first defect address in a nonvolatile fashion, and said second defect address storage circuit holds said second defect address in a nonvolatile fashion.

11. A semiconductor storage device according to claim 10, wherein said first defect address storage circuit includes a plurality of first fuses, and said second defect address storage circuit includes a plurality of second fuses.

12. A semiconductor storage device according to claim 11, wherein said control circuit is in said second state in the case where said second fuses are in a predetermined state.

13. A semiconductor storage device according to claim 9, wherein said memory cells and said redundant memory cells are of dynamic type.

14. A semiconductor storage device comprising:

a plurality of word lines;

a plurality of memory cells coupled to said word lines;

a decoder circuit coupled to said word lines;

a plurality of redundant word lines;

a plurality of redundant memory cells coupled to said redundant word lines;

a redundant decoder circuit coupled to said redundant word lines; and a control circuit corresponding to said redundant word lines;

wherein said decoder circuit is supplied with a first address signal and a second address signal, said decoder circuit selects one of said word lines on the basis of said first address signal and said second address signal, said control circuit is supplied with said first address signal and said second address signal and includes a defect address storage circuit adapted to store a first defect address corresponding to said first address signal and a second defect address corresponding to said second address signal, said control circuit outputs a control signal upon decision that said first address signal and said second address signal represent defect addresses, said redundant decoder circuit is supplied with said second address signal, and said redundant decoder circuit selects one of said redundant word lines on the basis of said second address signal upon receipt of said control signal from said control circuit.

15. A semiconductor storage device according to claim 14, wherein said defect address storage circuit holds said first defect address and said second defect address in a nonvolatile fashion.

16. A semiconductor storage device according to claim 15, wherein said defect address storage circuit includes a plurality of first fuses for holding said first defect address and a plurality of second fuses for holding said second defect address.

17. A semiconductor storage device according to claim 14, wherein said memory cells and said redundant memory cells are of dynamic type.

18. A semiconductor storage device, supplied with first address signals and second address signals, comprising:

a plurality of main word lines;

a plurality of sets of subword lines which are provided for said plurality of main word lines, respectively;

a set of redundant subword lines;

a decision circuit which holds a first defect information and a second defect information and outputs a detection signal in the case where said first address signals coincide with said first defect information and a predetermined part of said second address signals coincides with said second defect information;

a plurality of selection signal lines;

a plurality of sets of subword line drivers, each of which is connected to a corresponding one of said plurality of main word lines and said plurality of selection signal lines; and a set of redundant subword line drivers connected to said plurality of selection signal lines;

wherein one of said main word lines is selected on the basis of said first address signals, wherein said plurality of selection signal lines are driven on the basis of said second address signals so that, in conjunction with selection of a predetermined one of said main word lines, one of said subword lines is selected on the basis of said second address signals, and wherein one of said redundant subword lines is selected instead of one of said subword lines on the basis of said second address signals in the case where said detection signal is outputted.

19. A semiconductor storage device according to claim 18, wherein said decision circuit includes:

a plurality of MOSFETs with gates thereof supplied with complementary, non-inverted and inverted ones of said first address signals and complementary, non-inverted and inverted ones of said second address signals, respectively; and a plurality of fuses, each connected in series with a respective one of said plurality of MOSFETs between a reference potential and a common node which is merged to produce a wired logic signal, wherein a pair of fuses, corresponding to one bit of said second address signals, are burnt out when the number of subword lines to be relieved as a unit is doubled.

20. A semiconductor storage device according to claim 19, wherein said common node effects a wired-OR logic operation to produce said detection signal.

* * * * *

UNITED STATES PATENT AND TRADEMARK OFFICE
CERTIFICATE OF CORRECTION

PATENT NO. : 5,862,086
DATED : January 19, 1999
INVENTOR(S) : MAKIMURA ET AL.

It is certified that error appears in the above-identified patent and that said Letters Patent is hereby corrected as shown below:

On title page,

In Item [73], Assignees,

Delete "Instuments" and insert -- Instruments --.

Signed and Sealed this

Eighth Day of August, 2000

Attest:

Q. TODD DICKINSON

*Attesting Officer*      *Director of Patents and Trademarks*